United States Patent
Im et al.

(10) Patent No.: US 12,368,085 B2
(45) Date of Patent: Jul. 22, 2025

(54) INTEGRATION OF SEMICONDUCTOR DEVICE ASSEMBLIES WITH THERMAL DISSIPATION MECHANISMS

(71) Applicant: SEMICONDUCTOR COMPONENTS INDUSTRIES, LLC, Scottsdale, AZ (US)

(72) Inventors: Seungwon Im, Bucheon (KR); Dongwook Kang, Bucheon (KR); Oseob Jeon, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/635,186

(22) Filed: Apr. 15, 2024

(65) Prior Publication Data
US 2024/0282663 A1  Aug. 22, 2024

Related U.S. Application Data

(63) Continuation of application No. 17/247,585, filed on Dec. 17, 2020, now Pat. No. 11,961,782.

(60) Provisional application No. 62/972,431, filed on Feb. 10, 2020.

(51) Int. Cl.
| | |
|---|---|
| H01L 23/373 | (2006.01) |
| H01L 23/31 | (2006.01) |
| H01L 23/367 | (2006.01) |
| H01L 23/473 | (2006.01) |
| H01L 25/07 | (2006.01) |

(52) U.S. Cl.
CPC ...... *H01L 23/3735* (2013.01); *H01L 23/3107* (2013.01); *H01L 23/3672* (2013.01); *H01L 23/473* (2013.01); *H01L 25/072* (2013.01)

(58) Field of Classification Search
CPC .................................................. H01L 23/3735
USPC ........................................................ 257/703
See application file for complete search history.

(56) References Cited

U.S. PATENT DOCUMENTS

| | | | |
|---|---|---|---|
| 2013/0058041 A1 | 3/2013 | Gohara et al. | |
| 2016/0163948 A1* | 6/2016 | Wang | H10N 10/01 438/54 |
| 2017/0341638 A1* | 11/2017 | Sawada | H05K 7/20927 |
| 2020/0132392 A1* | 4/2020 | Joshi | H05K 7/2039 |

FOREIGN PATENT DOCUMENTS

CN  207184442 U  4/2018

* cited by examiner

*Primary Examiner* — Ajay Arora
(74) *Attorney, Agent, or Firm* — Brake Hughes Bellermann LLP

(57) ABSTRACT

In a general aspect, an electronic device assembly can include a semiconductor device assembly including a ceramic substrate; a patterned metal layer disposed on a first surface of the ceramic substrate; and a semiconductor die disposed on the patterned metal layer. The electronic device assembly can also include a thermal dissipation appliance. Ceramic material of a second surface of the ceramic substrate can be direct-bonded to a surface of the thermal dissipation appliance. The second surface of the ceramic substrate can be opposite the first surface of the ceramic substrate.

20 Claims, 20 Drawing Sheets

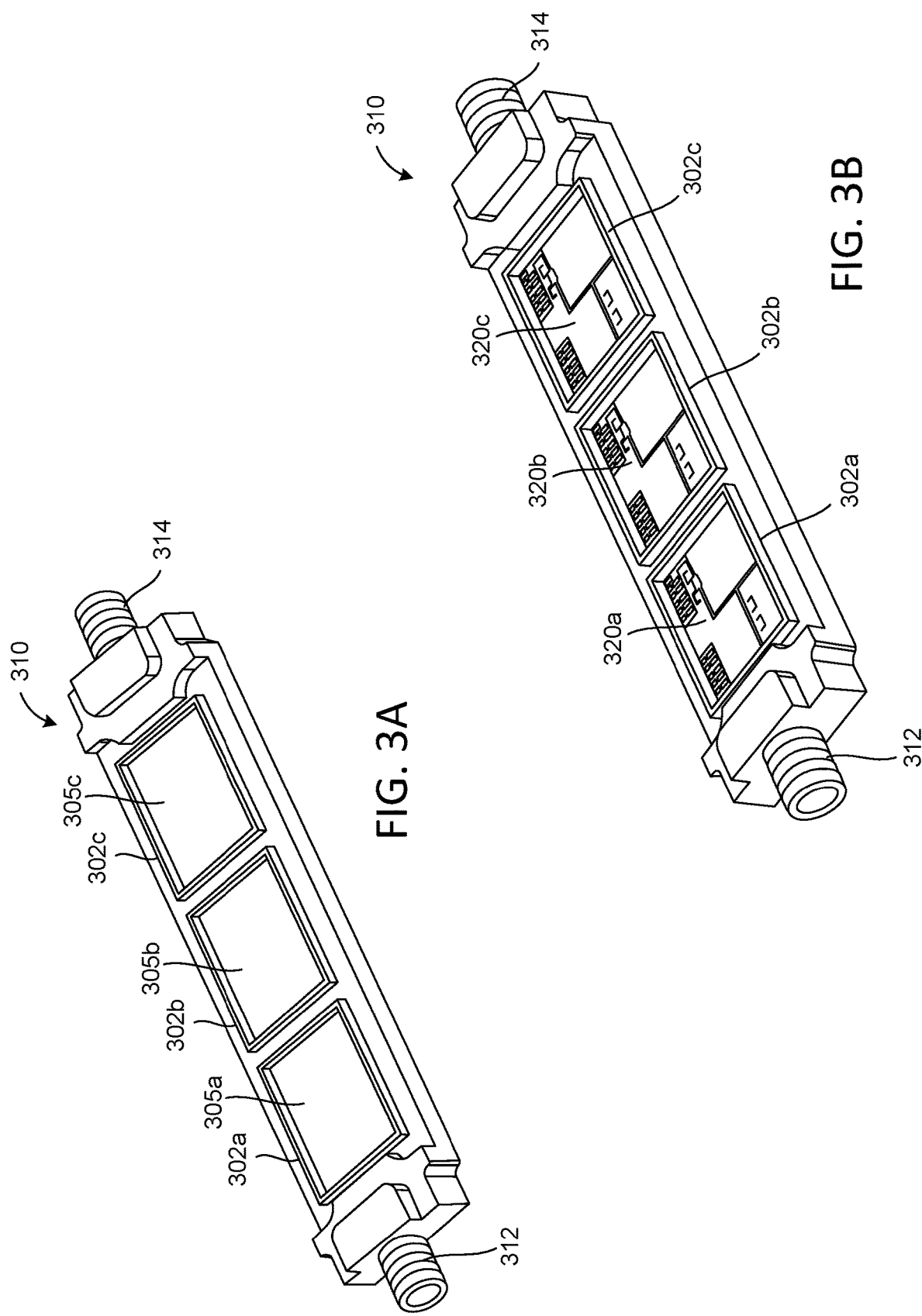

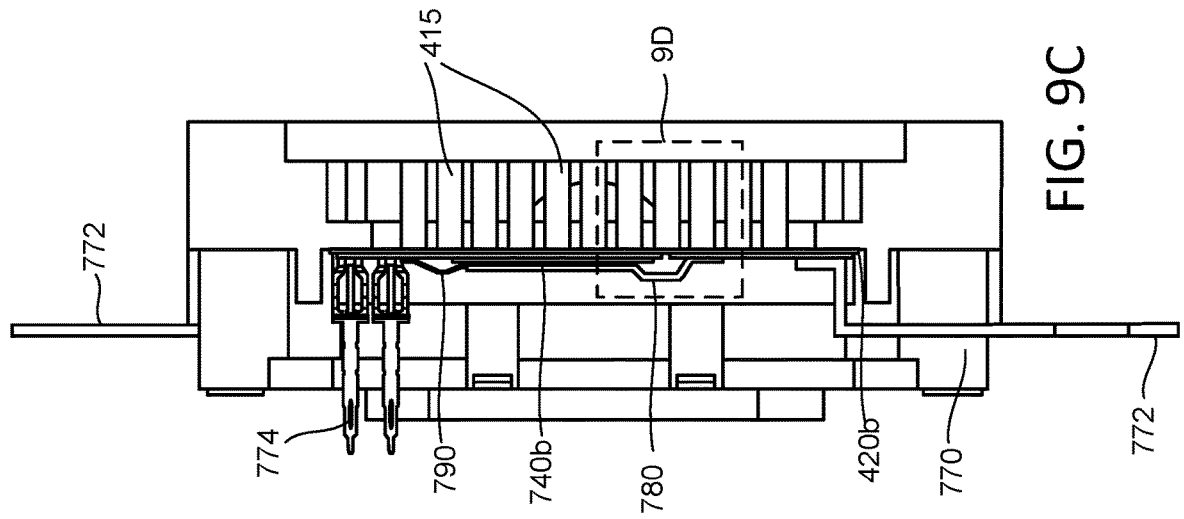
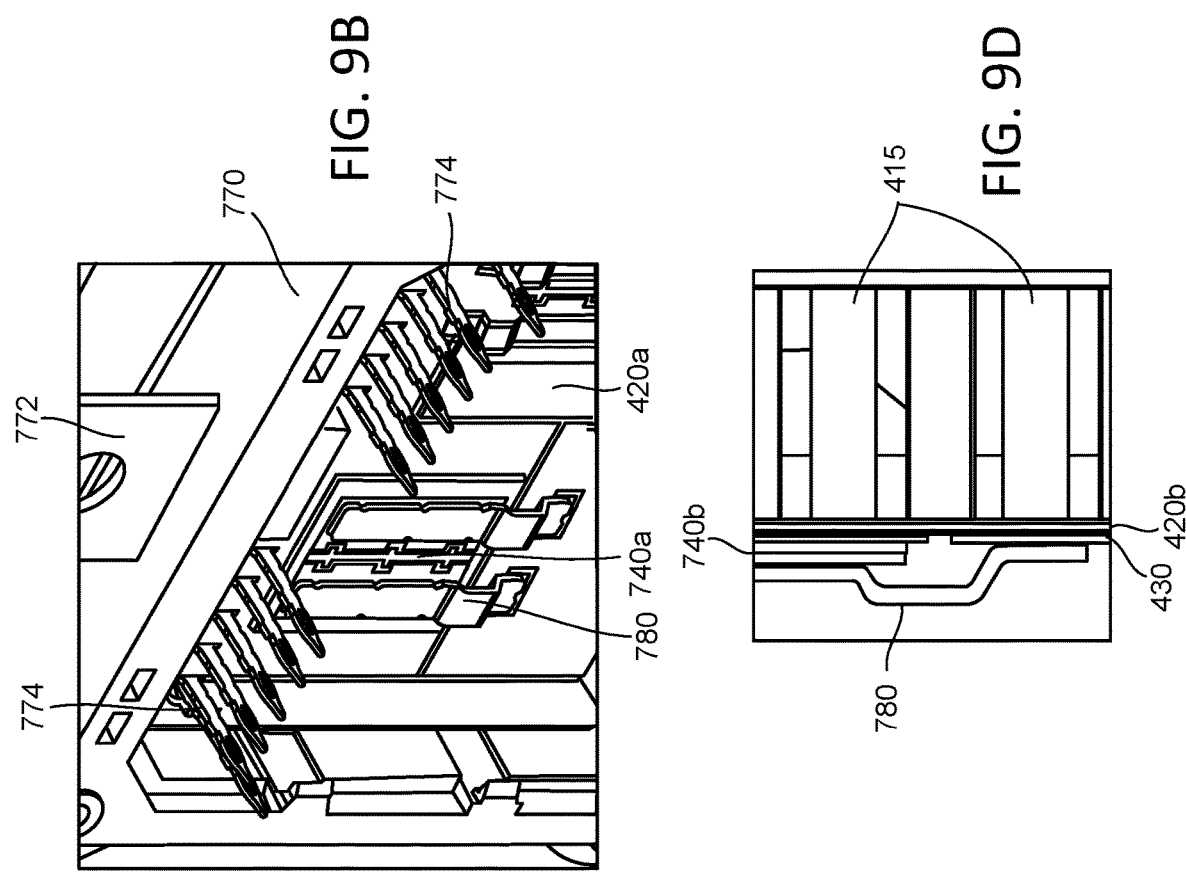

INTEGRATION OF SEMICONDUCTOR DEVICE ASSEMBLIES WITH THERMAL DISSIPATION MECHANISMS

CROSS-REFERENCE TO RELATED APPLICATION

This application is a continuation application of U.S. patent application Ser. No. 17/247,585, filed on Dec. 17, 2020, which claims the benefit of U.S. Provisional Application No. 62/972,431, filed on Feb. 10, 2020, these applications are incorporated by reference herein in their entireties.

TECHNICAL FIELD

This description relates to semiconductor device assemblies. More specifically, this description relates to semiconductor device assemblies (e.g., semiconductor device modules) that include substrates that are integrated with (e.g., direct-bonded to) thermal dissipation mechanisms (e.g., heat sinks, water jackets, etc.).

BACKGROUND

Semiconductor device assemblies, such as assemblies including power semiconductor devices (which can be referred to as power modules, multi-chip power modules, etc.), can be implemented using semiconductor die, substrates (e.g., direct-bonded metal substrates, ceramic substrates, and so forth), wire bonds, etc. Such semiconductor device assemblies can be coupled with a thermal dissipation mechanism, appliance, device, apparatus, etc. (e.g., a heat sink, a water jacket, etc.), that can dissipate heat generated during operation of included semiconductor devices (die).

For instance, in some implementations, a semiconductor device assembly can be coupled with a respective thermal dissipation mechanism using a thermal-interface material (TIM), which can be referred to as an indirect cooling configuration. In some implementations, a semiconductor device assembly can be coupled with a respective thermal dissipation mechanism using a soldering or sintering material, which can be referred to as a direct cooling configuration. Such approaches have certain drawbacks, however. For instance, materials that are used for TIM in indirect cooling arrangements can have relatively high thermal resistance (e.g. as compared to a thermal resistance of the thermal dissipation mechanism), which can reduce overall cooling efficiency of such implementations. Further, for current direct-cooling implementations voids can occur in a solder or sintering layer. Such voids can increase thermal resistance between the semiconductor device assembly substrate and the associated thermal dissipation mechanism (e.g., as compared a void-less solder or sintering layer), which can reduce overall cooling efficiency of such implementations.

SUMMARY

In a general aspect, an electronic device assembly can include a semiconductor device assembly and a thermal dissipation appliance. The semiconductor device assembly can include a ceramic substrate, a patterned metal layer disposed on a first surface of the ceramic substrate, and a semiconductor die disposed on the patterned metal layer. In the electronic device assembly, ceramic material of a second surface of the ceramic substrate can be direct-bonded to a surface of the thermal dissipation appliance. The second surface of the ceramic substrate can be opposite the first surface of the ceramic substrate.

In another general aspect, an electronic device assembly can include a first semiconductor device assembly, a second semiconductor device assembly, and a thermal dissipation appliance. The first semiconductor device assembly can include a first ceramic substrate, a first patterned metal layer disposed on a first surface of the first ceramic substrate; and a first semiconductor die disposed on the first patterned metal layer. The second semiconductor device assembly can include a second ceramic substrate, a second patterned metal layer disposed on a first surface of the second ceramic substrate, and a second semiconductor die disposed on the second patterned metal layer. The thermal dissipation appliance can be direct-bonded to ceramic material of a second surface of the first ceramic substrate and ceramic material of a second surface of the second ceramic substrate. The second surface of the first ceramic substrate can be opposite the first surface of the first ceramic substrate. The second surface of the second ceramic substrate can be opposite the first surface of the second ceramic substrate.

BRIEF DESCRIPTION OF THE DRAWINGS

FIG. 3A is an isometric diagram illustrating an implementation of a water jacket.

FIG. 3B is an isometric diagram illustrating the water jacket of FIG. 3A after integration with semiconductor device assembly substrates.

FIGS. 9A-9D are diagrams illustrating various aspects of an implementation of the semiconductor device modules (e.g., electronic device assembly) of, e.g., FIGS. 7A-7G.

Figure 1:
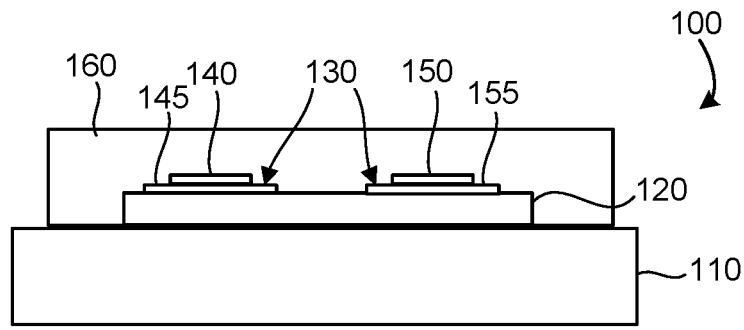
FIG. 1 is a diagram schematically illustrating a side view of an integrated semiconductor device assembly and thermal dissipation appliance.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

This disclosure relates to implementations of electronic device assemblies that can be used to implement, e.g., power semiconductor device assemblies, such as multichip modules (MCMs) with direct cooling. Such assemblies can be used in, e.g., automotive applications, industrial applications, etc. For instance, the implementations described herein can be implemented in high-power modules, such as power converters, ignition circuits, power transistor pairs, etc.

In the implementations described herein, a substrate (e.g., a ceramic substrate, a dielectric substrate, etc.) and a thermal transfer mechanism, appliance, device, apparatus, etc. (e.g., a water jacket, a heat sink, etc.) can be integrated with each other. For instance, the substrate can be direct-bonded to the thermal transfer mechanism. A semiconductor device assembly (module, circuit, etc.) can then be implemented using the integrated substrate and thermal dissipation appliance. Such implementations can improve thermal dissipation performance (e.g., reduce junction-to-sink thermal resistance) as compared to current indirect cooling approaches (e.g., using thermal-interface materials), as well as compared to current direct cooling approaches (e.g., using solder), such as were described above.

FIG. 1 is a diagram schematically illustrating a side view of an electronic device assembly 100 (assembly 100) that includes an integrated semiconductor device assembly and thermal dissipation appliance (mechanism, device, apparatus, etc.). As shown in FIG. 1, the assembly 100 includes a thermal dissipation appliance 110 and a semiconductor device assembly that is integrated with the thermal dissipation appliance 110. In this example, the semiconductor assembly can include a substrate 120 (e.g. a ceramic substrate, a dielectric substrate, etc.), a patterned metal layer 130, and a first semiconductor die 140 and a second semiconductor die 150 disposed on the patterned metal layer 130.

In the assembly 100 of FIG. 1, the patterned metal layer 130 includes a first portion 145 (e.g., corresponding with the semiconductor die 140) and a second portion 155 (e.g., corresponding with the semiconductor die 150). In some implementations the semiconductor die 140 and 150 can be disposed on a single portion of the patterned metal layer 130, rather than separate portions 145 and 155, as shown in FIG. 1. The assembly 100 can also include a molding compound 160 that encapsulates elements of the semiconductor device assembly (e.g., the substrate 120, the patterned metal layer 130 and the semiconductor die 140 and 150).

In some implementations, such as in the example assembly of FIG. 1, the patterned metal layer 130 and the semiconductor die 140 and 150 can be disposed on a first side (surface) of the substrate 120. A second side of the substrate 120, opposite the first side of the substrate 120, can be direct-bonded (e.g., directly coupled, directly bonded, etc.) to the thermal dissipation appliance 110. For example, ceramic material of the second side of the substrate 120 can be direct-bonded to the thermal dissipation appliance 110. In some implementations, the substrate 120 can be direct-bonded to the thermal dissipation appliance 110 using diffusion bonding. For instance, in some implementations, a titanium (Ti) seed layer can be used to facilitate (e.g., catalyze, etc.) diffusion bonding between the substrate 120 and the thermal dissipation appliance 110. Such a process can be referred to as titanium diffusion (Ti-diffusion) bonding. In some implementations, the Ti seed layer can be deposited (sputtered, etc.) onto the second side of the substrate 120 and/or onto the thermal dissipation appliance 110, and Ti-diffusion bonding can be performed at a temperature of greater than 900° Celsius (C), e.g., in a range of 900-1000° C., and at high pressure, e.g., in a range of 7-10 Megapascals (MPa), which can result in materials (e.g., metals) from the substrate 120 and the thermal dissipation appliance 110 diffusing between one another, to directly-bond the substrate 120 to the thermal dissipation appliance 110. In some implementations, the substrate 120 can be direct-bonded to the thermal dissipation appliance 110 using a brazing process.

In the assembly 100, the molding compound 160 can be an epoxy molding compound, a resin molding compound, a gel molding compound, etc. As noted above, the molding compound 160 can encapsulate elements of the assembly 100 (e.g., elements of the semiconductor device assembly disposed on the substrate 120, as well as the substrate 120). Though not specifically shown in FIG. 1, in some implementations, other elements can be included in the assembly 100, such as signal pins, power terminals, output terminals, conductive clips, wire bonds, etc. The specific elements included in an electronic device assembly will depend on the particular implementation.

Figure 2A:
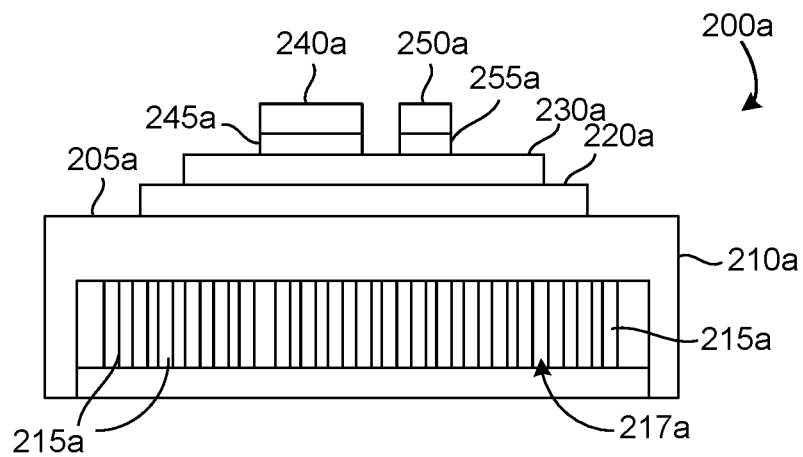
FIG. 2A is a diagram schematically illustrating a side view of an implementation of the integrated semiconductor device assembly and thermal dissipation appliance of FIG. 1.

FIG. 2A is a diagram schematically illustrating a side view of an implementation of an electronic device assembly 200a that can implement the assembly 100 (e.g., the integrated semiconductor device assembly and thermal dissipation appliance) of FIG. 1. As shown in FIG. 2A, the assembly 200a includes a water jacket (thermal dissipation appliance) 210a and a semiconductor device assembly that is integrated with the water jacket 210a. In this example, the semiconductor assembly can include a substrate 220a (e.g. a ceramic substrate), a patterned metal layer 230a disposed on the substrate 220a, and a first semiconductor die 240a and a second semiconductor die 250a disposed on the patterned metal layer 230a. While not shown in FIG. 2A, the assembly 200a can also include a molding compound that can encapsulate elements of the semiconductor device assembly, such as described above with respect to FIG. 1 and further described below.

In some implementations, such as in the example assembly 200a of FIG. 2A, the patterned metal layer 230a and the semiconductor die 240a and 250a can be disposed on a first side (e.g., upper surface) of the substrate 220a. For instance, the semiconductor die 240a can be coupled to the metal layer 230a by solder 245a (e.g., a solder preform, solder print, conductive epoxy, or other conductive die attach material). Likewise, the semiconductor die 250a can be coupled to the metal layer 230a by solder 255a (e.g., a solder preform, solder print, conductive epoxy, or other conductive die attach material).

In the assembly 200a, a second side (lower surface) of the substrate 220a, opposite the first side of the substrate 220a, is direct-bonded (e.g., directly coupled, directly bonded, etc.) to an outer (exterior) surface 205a of the water jacket 210a. For example, ceramic material of the second side (e.g., lower surface in FIG. 2A) of the substrate 220a can be direct-bonded to the outer surface 205a. In some implementations, the substrate 220a can be direct-bonded to the surface 205a of the water jacket 210a using the approaches described above (e.g., diffusion bonding, Ti-diffusion bonding, brazing, etc.).

As shown in FIG. 2A, the water jacket 210a includes a fluidic channel 217a that is defined therethrough. For instance, in operation, water (or other cooling liquid) can flow through the fluidic channel 217a (e.g., from an inlet to an outlet) to facilitate dissipation of heat generated by semiconductor die 240a and 250a (as well as any other heat generating components). As illustrated in FIG. 2A, a portion of the water jacker 210a that includes the surface 205a can define a portion (e.g., at least part of an upper wall) of the fluidic channel 217a of the water jacket 210a. As also shown in FIG. 2A, the water jacket 210a includes a plurality of cooling fins 215a (e.g., pin fins) that are disposed within the fluidic channel 217a. In operation, water (or other cooling fluid) flowing in the fluidic channel 217a can flow over the cooling fins 215a, increasing surface area of the water jacket 210a that is in contact with the cooling fluidic (e.g., as compared to just a perimeter (wall) of the fluidic channel 217a, which can improve thermal dissipation efficiency of the water jacket 210a.

As with the assembly 100 of FIG. 1, though not specifically shown in FIG. 2A, in some implementations, other elements can be included in the assembly 300, such as signal pins, power terminals, output terminals, conductive clips, wire bonds, etc. The specific elements included in an electronic device assembly will depend on the particular implementation.

Figure 2B:
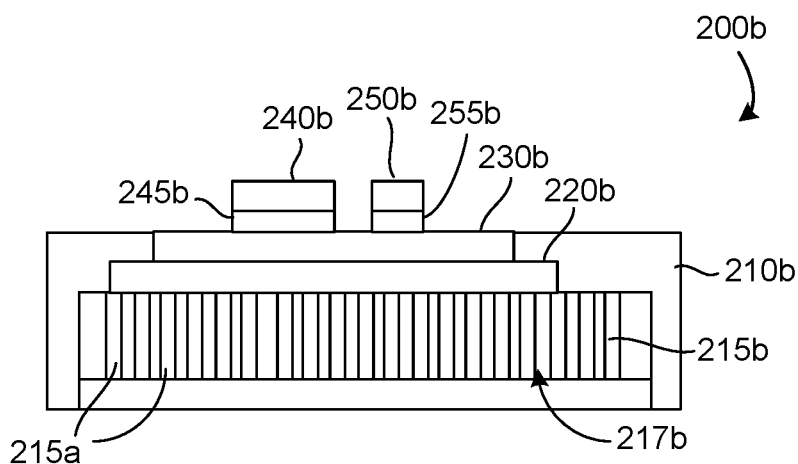
FIG. 2B is a diagram schematically illustrating a side view of an implementation of the integrated semiconductor device assembly and thermal dissipation appliance of FIG. 1.

FIG. 2B is a diagram schematically illustrating a side view of an implementation of an electronic device assembly 200b that can also implement the assembly 100 (e.g., the integrated semiconductor device assembly and thermal dissipation appliance) of FIG. 1. As shown in FIG. 2B, the assembly 200b includes a water jacket (thermal dissipation appliance) 210b and a semiconductor device assembly that is integrated with the water jacket 210b. In this example, the semiconductor assembly can include a substrate 220b (e.g. a ceramic substrate), a patterned metal layer 230b disposed on the substrate 220b, and a first semiconductor die 240b and a second semiconductor die 250b disposed on the patterned metal layer 230a. While not shown in FIG. 2B, the assembly 200b, as with the assembly 200a of FIG. 2A, can also include a molding compound that can encapsulate elements of the semiconductor device assembly, such as described above with respect to FIG. 1 and further described below.

In some implementations, such as in the example assembly 200b of FIG. 2A, the patterned metal layer 230b and the semiconductor die 240b and 250b can be disposed on a first side (e.g., upper surface) of the substrate 220b. For instance, the semiconductor die 240b can be coupled to the metal layer 230b by solder 245b (e.g., a solder preform, solder print, conductive epoxy, or other conductive die attach material). Likewise, the semiconductor die 250b can be coupled to the metal layer 230b by solder 255b (e.g., a solder preform, solder print, conductive epoxy, or other conductive die attach material).

In the assembly 200b, a second side (lower surface) of the substrate 220b, opposite the first side of the substrate 220b, is direct-bonded (e.g., directly coupled, directly bonded, etc.) to cooling fins 215b (e.g., pin fins) of the water jacket 210a. For example, ceramic material of the second side (e.g., lower surface in FIG. 2A) of the substrate 220a can be direct-bonded to (e.g., upper surfaces) of the cooling fins 215b. In some implementations, the substrate 220b can be direct-bonded to the cooling fins 215b of the water jacket 210b using the approaches described above (e.g., diffusion bonding, brazing, etc.).

As shown in FIG. 2B, similar to the assembly 200a of FIG. 2A, the water jacket 210b includes a fluidic channel 217b that is defined therethrough. For instance, in operation, water (or other cooling fluid) can flow through the fluidic channel 217b (e.g., from an inlet to an outlet) to dissipate heat generated by semiconductor die 240b and 250b (as well as any other heat generating components). As illustrated in FIG. 2B, the surface of the substrate 220b that is direct-bonded to the cooling fins 215b can define a portion (e.g., at least part of an upper wall) of the fluidic channel 217b of the water jacket 210b. As also shown in FIG. 2B, similar to the cooling fins 215a and the fluidic channel 217a, the plurality of cooling fins 215b (e.g., pin fins) of the water jacket 210b are disposed within the fluidic channel 217b. In operation, water (or other cooling fluid) flowing in the fluidic channel 217b can flow over the cooling fins 215b (and the surface of the substrate direct-bonded to the cooling fins 215b), increasing surface area of the water jacket 220b that is in contact with the cooling fluidic, which can improve thermal dissipation efficiency of the water jacket 210b and the substrate 220b.

As with the assembly 100 of FIG. 1 and the assembly 200a of FIG. 2A, though not specifically shown in FIG. 2B, in some implementations, other elements can be included in the assembly 200b, such as signal pins, power terminals, output terminals, conductive clips, wire bonds, etc. The specific elements included in an electronic device assembly will depend on the particular implementation.

FIG. 3A is an isometric diagram illustrating an implementation of a water jacket 310 that can be used to implement electronic device assemblies, such as those described herein. As shown in FIG. 3A, the water jacket 310 can include protrusions (walls, raised portions, frames, etc.) 302a, 302b and 302c, which define respective recesses in the water jacket 310. In this example, the water jacket 310 also includes surfaces 305a, 305b and 305c, which define respective bottom surfaces of the recesses corresponding with the protrusions 302a, 302b and 302c. As described further below, the recesses of the protrusions 302a, 302b and 302c can correspond with respective semiconductor device assemblies (semiconductor device modules, semiconductor device assembly substrates, etc.) that are integrated with the water jacket 310.

As shown in FIG. 3A, the water jacket 310 also includes an inlet 312 and an outlet 314, where the inlet 312 and the outlet 314 can be fluidically connected by a fluidic channel of the water jacket 310 (e.g., such as the fluidic channel 217a of FIG. 2A). For instance, a fluidic channel of the water jacket 310 can have a plurality of cooling fins (e.g., pin fins) disposed therein. In operation, water (or other cooling liquid) can flow (e.g., under hydraulic pressure) from the inlet 312, through the fluidic channel, to the outlet 314 to facilitate transfer of the heat generated by semiconductor device assemblies that are integrated with the water jacket 310 out of the water jacket 310.

FIG. 3B is an isometric diagram illustrating the water jacket 310 of FIG. 3A after integration with semiconductor device assembly substrates 320a, 320b and 320c. As shown in FIG. 3B, the substrates 320a, 320b and 320c can be direct-bonded, respectively (e.g., using the approaches described herein), to the surfaces 305a, 305b and 305c (not visible in FIG. 3B) of the water jacket 310 of FIG. 3A. In other words, the substrates 320a-320c can be direct-bonded with respective bottom surfaces of the recesses defined by the protrusions 302a-302c.

Figure 4A:
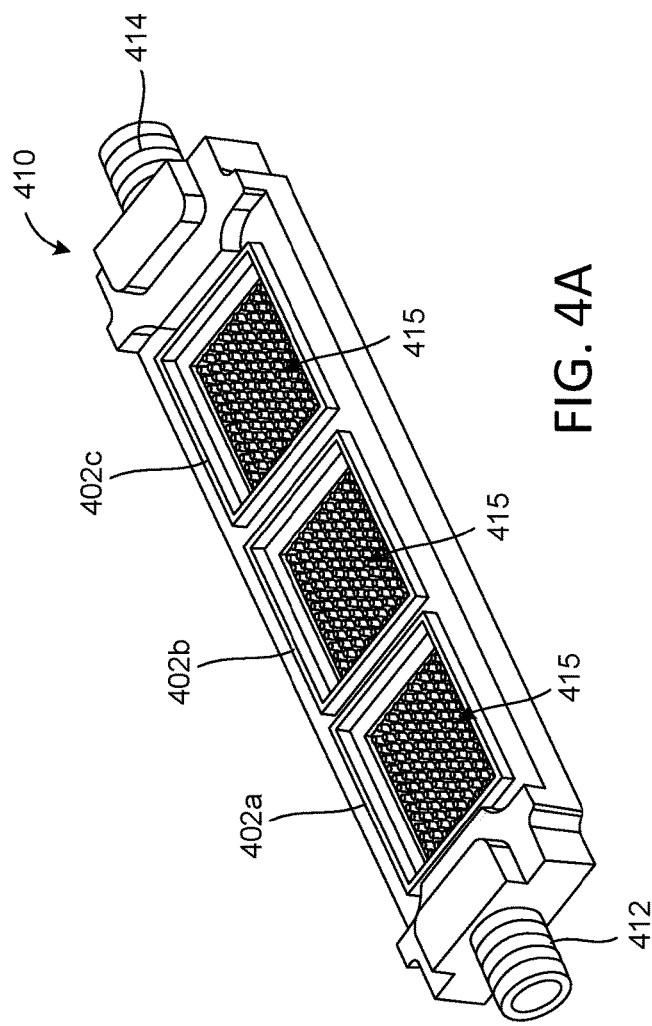
FIG. 4A is an isometric diagram illustrating an implementation of another water jacket.

FIG. 4A is an isometric diagram illustrating an implementation of a water jacket 410 that can be used to implement electronic device assemblies, such as those described herein. As shown in FIG. 4A, as with the water jacket 310, the water jacket 410 can include protrusions (walls, raised portions, frames, etc.) 402a, 402b and 402c, which define respective recesses in the water jacket 410. In this example, cooling fins 415 that are disposed within a fluidic channel of the water jacket 410 can be exposed in the recesses defined by the protrusions 402a-402c. As described further below, the recesses of the protrusions 402a-402c can correspond with respective semiconductor device assemblies (semiconductor device modules, etc.) that are integrated with the water jacket 410.

As shown in FIG. 4A, the water jacket 410 also includes an inlet 412 and an outlet 414, where the inlet 412 and the outlet 414 are fluidically connected by the fluidic channel of the water jacket 410 (e.g., such as the fluidic channel 217b of FIG. 2B). For instance, a fluidic channel of the water jacket 410 can have the plurality of cooling fins 415 (e.g., pin fins) disposed therein. In operation (after integration of semiconductor device assemblies with the water jacket 410), water (or other cooling liquid) can flow (e.g., under hydraulic pressure) from the inlet 412, through the fluidic channel, to the outlet 414 to facilitate transfer of the heat generated by semiconductor device assemblies that are integrated with the water jacket 410 out of the water jacket 410.

Figure 4B:
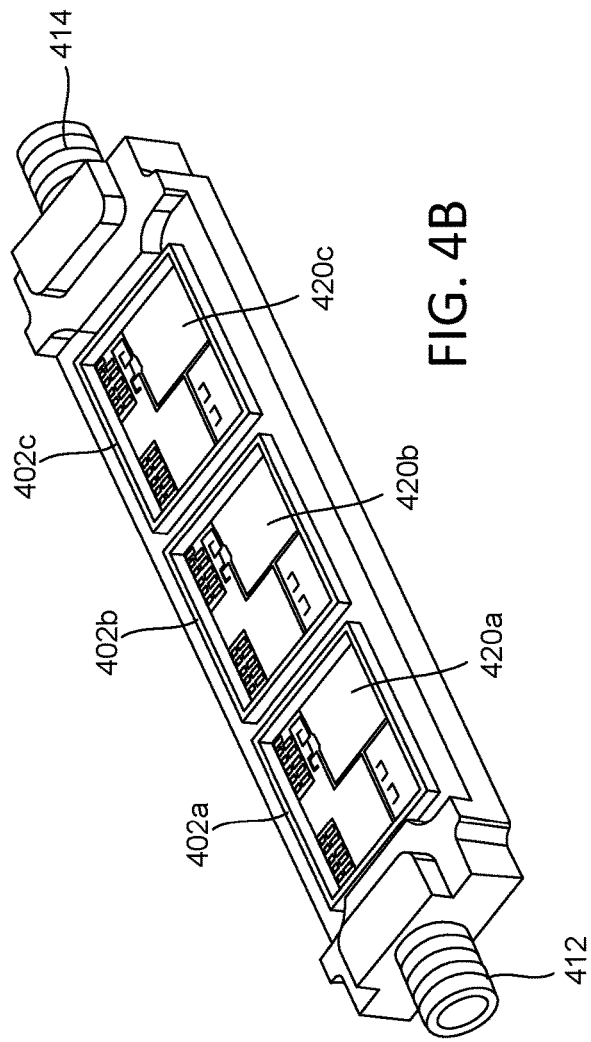
FIG. 4B is an isometric diagram illustrating the water jacket of FIG. 4A after integration with semiconductor device assembly substrates.

FIG. 4B is an isometric diagram illustrating the water jacket 410 of FIG. 4A after integration with semiconductor device assembly substrates 420a, 420b and 420c. As shown in FIG. 4B, the substrates 420a, 420b and 420c can be direct-bonded, respectively (e.g., using the approaches described herein), to the respective cooling fins 415 (not visible in FIG. 4B) disposed in the recessed defined by the protrusions 402a-402c. In other words, the substrates 420a-420c can be direct-bonded with upper surfaces of respective cooling pins disposed in (and exposed in) the recesses defined by the protrusions 402a-402c of the water jacket 410.

FIGS. 5A-5G are diagrams schematically illustrating a manufacturing process for producing semiconductor device modules using an implementation of the integrated substrates 320a-320c and water jacket 310 of FIG. 3B. For purposes of illustration, the following discussion of the manufacturing process of FIGS. 5A-5G is described with reference to a single semiconductor device assembly (e.g., a left-most semiconductor device assembly in the FIGS. 5A-5G) that is integrated with the water jacket 310. It will be appreciated that other semiconductor device assemblies of FIGS. 5A-5G (e.g., a center semiconductor device assembly and a right-most semiconductor device assembly) can be produced using a same, similar, or different process than described below. Also, reference numbers may be included in FIGS. 5A-5G that are not specifically discussed, but are shown by way of reference to other drawings (such as FIGS. 3A and 3B).

Figure 5A:
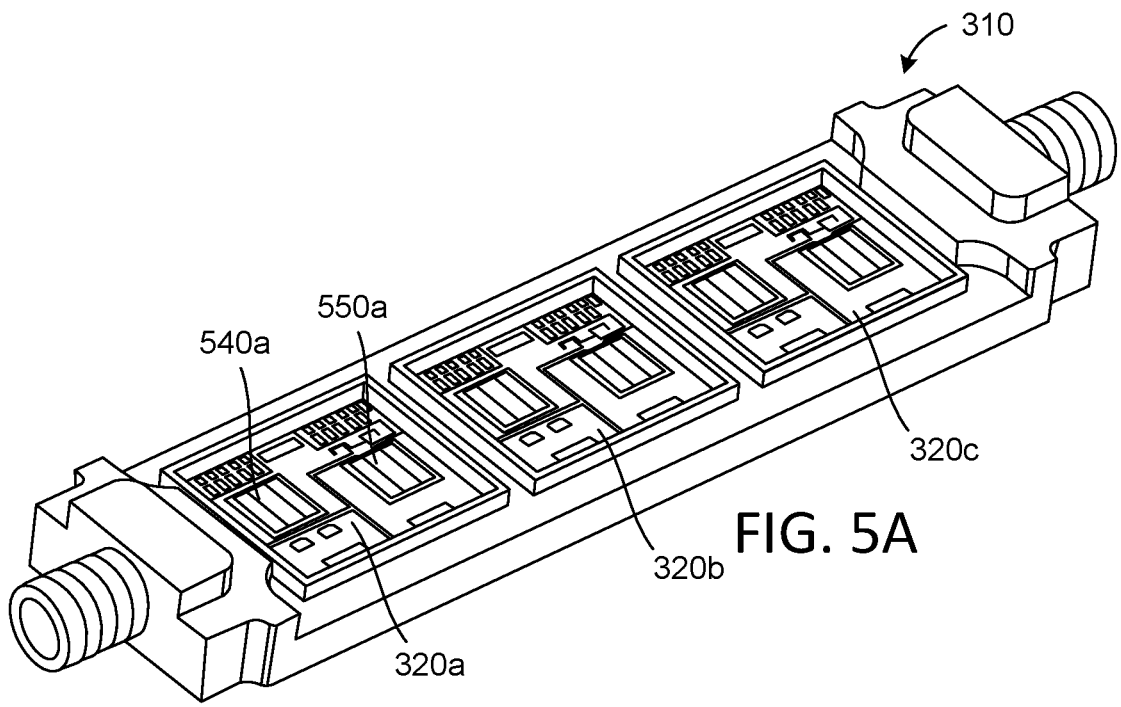
FIGS. 5A-5G are diagrams schematically illustrating a manufacturing process for producing semiconductor device modules (e.g., electronic device assemblies) using an implementation of the integrated semiconductor device assembly substrates and water jacket of FIG. 3B.
Figure 5B:
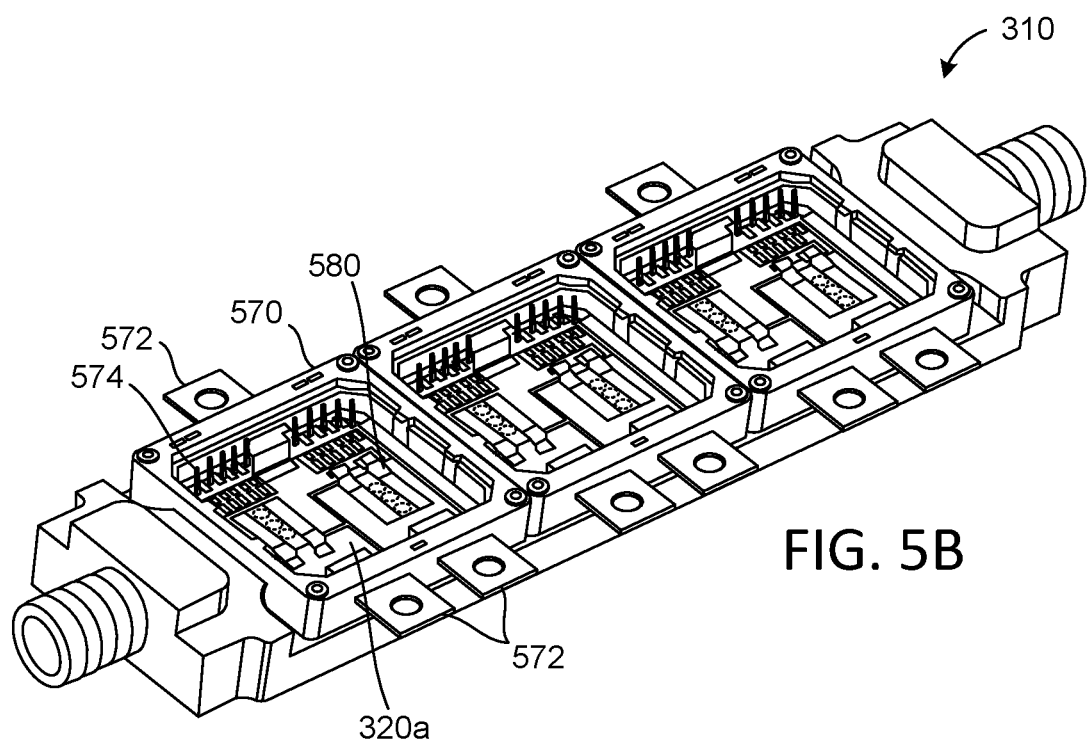

As shown in FIG. 5A, semiconductor devices 540a and 550a (e.g., wafer-level packaged devices, bare semiconductor die, etc.) can be coupled with the substrate 320a (e.g., on a patterned metal layer of the substrate 320a). As shown in FIG. 5B, a case 570 can be coupled with the water jacket 310, where the case 570 can be an injection-molded plastic frame that surrounds the substrate 320a, and can further define the recess of the water jacket 310 defined by the protrusion 302a, as described with respect to FIGS. 3A and 3B.

As also shown in the FIG. 5B, the case 570 can include power and output terminal 572, that are molded in the case 570. As also shown in FIG. 5B, signal pins 574 can be inserted (e.g., press-fit) into the substrate 320a. For instance, the signal pins 574 can be press-fit into plated openings in the substrate 320a, where the plated openings can be electrically connected with respective portions of a patterned metal layer of the substrate 320a. As also illustrated in FIG. 5B, at least one conductive clip 580 can be coupled with the semiconductor die 540a, the semiconductor die 550a and/or the substrate 320a (e.g., the patterned metal layer of the substrate 320a), e.g., to provide electrical connections between the substrate 320a, and the semiconductor die 540a and/or 540b.

Figure 5C:
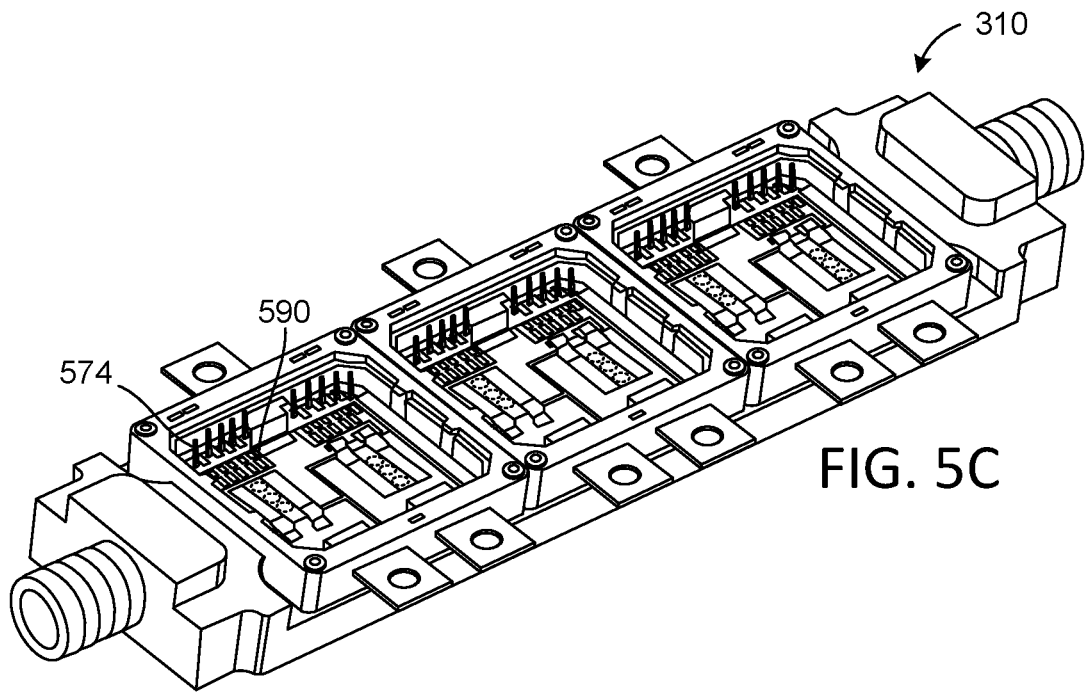
Figure 5D:
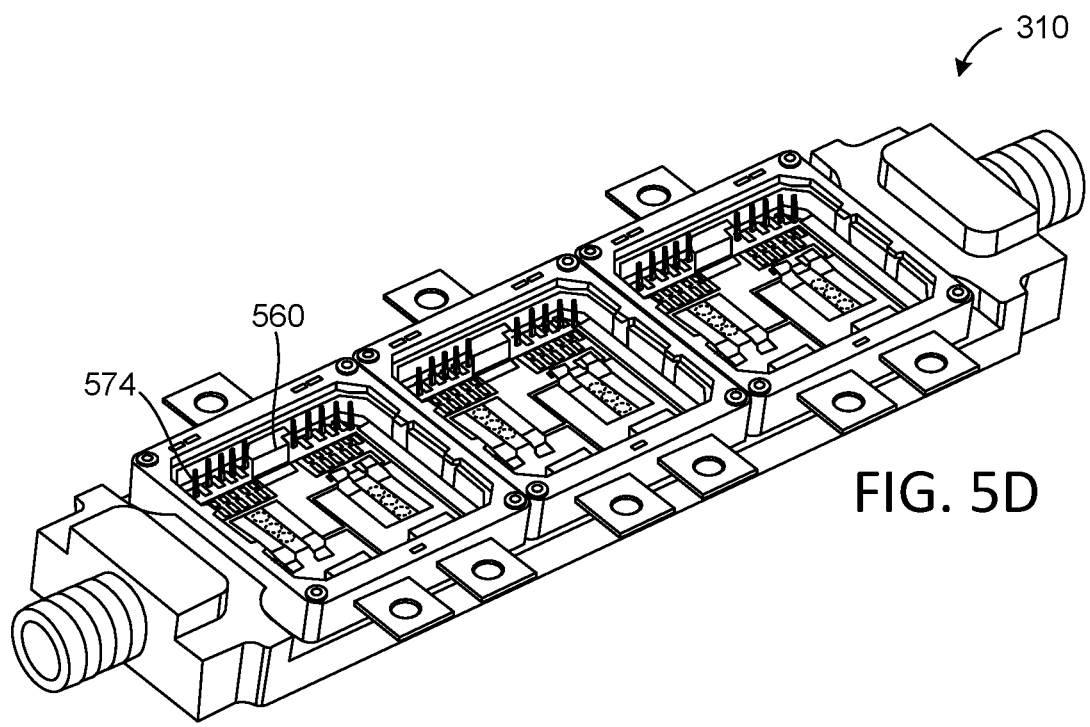
Figure 5E:
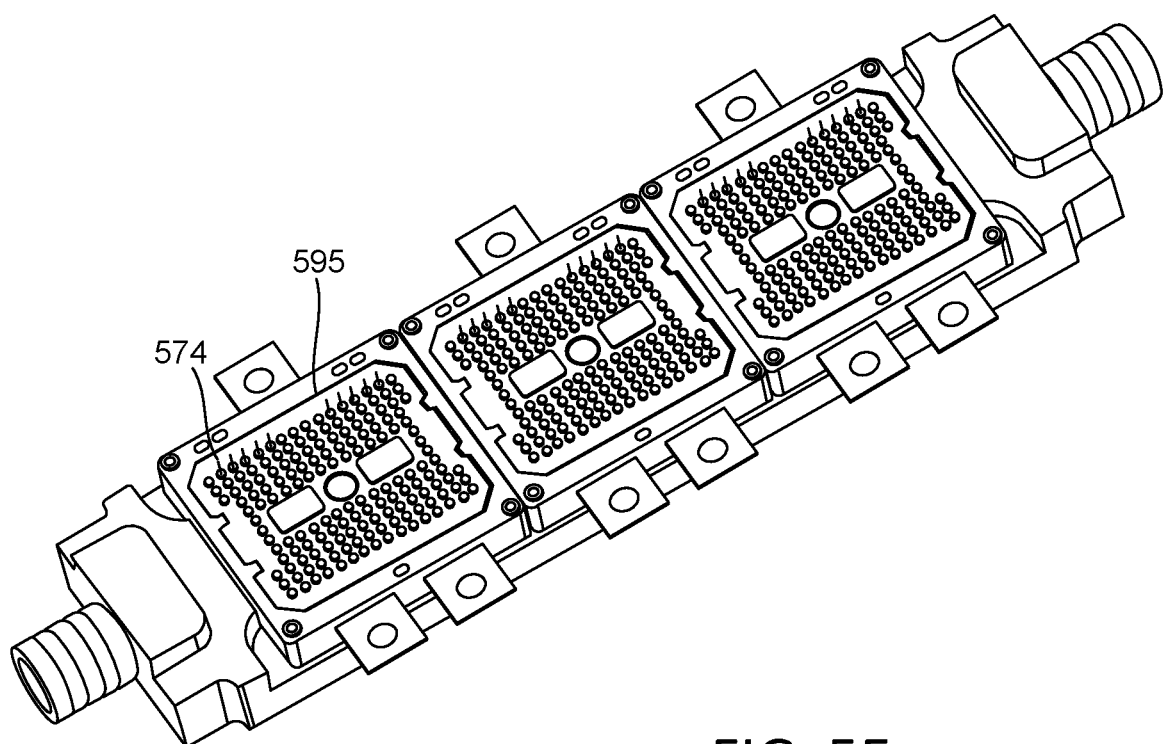

Referring now to FIG. 5C, wire bonds 590 can be formed, so as to establish respective electrical connections between the signal pins 574 and the semiconductor die 540a and/or 550a. As shown in FIG. 5D, the recess defined by the case 570 and/or the protrusion 302a (as shown in FIGS. 3A and 3B) can be filled, at least partially, with a molding compound 560 (e.g., a gel molding compound, or a resin molding compound), which can be translucent, and a cure operation can be performed to cure (set) the molding compound 560. As shown in FIG. 5D, the signal pins 574 can extend through the molding compound 560. Referring to FIG. 5E, a cover 595 can be coupled with the molding compound 560 using an adhesive material, such as a solder material . . . . In some implementations, the cover 595 can be attached (coupled, affixed, mounted, etc.) using a same, or similar solder material used to couple the signal pins 574 and/or the clip 580 with the substrate 320a and/or with the semiconductor die 540a and 550a. As shown in FIG. 5E, the cover 595 can have through holes defined therein, and the signal pins 574 can extend through the cover 595 (e.g., via respective through holes).

Figure 5F:
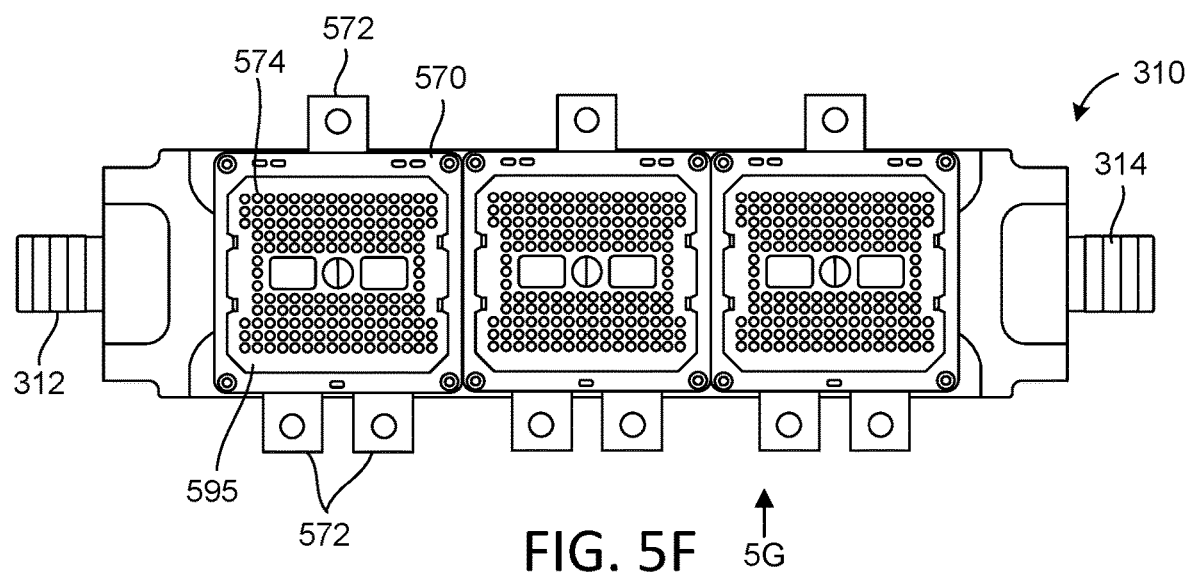
Figure 5G:
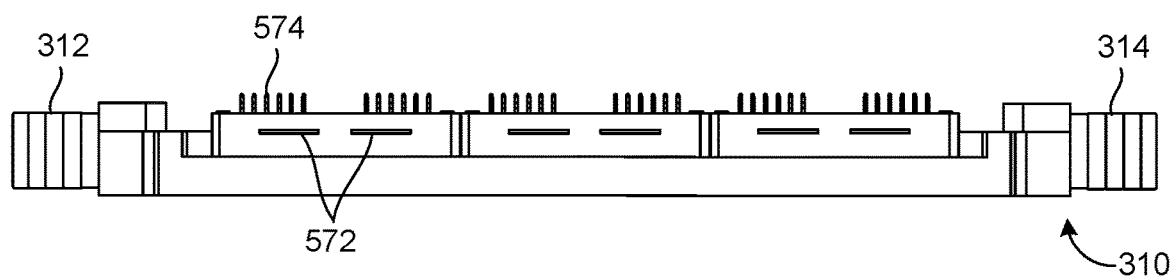

FIG. 5F illustrates a plan view of the water jacket 310 after producing three (e.g., left, center and right) integrated semiconductor device assemblies. FIG. 5G illustrates a side view corresponding with FIG. 5F (e.g., taken along a direction line 5G indicated in FIG. 5F). For purposes of reference and illustration, reference numbers are provided in FIGS. 5F and 5G for correspondence with, at least, FIGS. 3A-3B and 5A-5E, though the referenced elements are not specifically discussed again here with reference to FIGS. 5F and 5G.

FIGS. 6A-6F are diagrams schematically illustrating another manufacturing process for producing semiconductor device modules using an implementation of the integrated substrates 320a-320c and water jacket 310 of FIG. 3B. For purposes of illustration, the following discussion of the manufacturing process of FIGS. 6A-6F is described with reference to a single semiconductor device assembly (e.g., a left-most semiconductor device assembly in the FIGS.

6A-6F) that is integrated with the water jacket 310. It will be appreciated that other semiconductor device assemblies of FIGS. 6A-6F (e.g., a center semiconductor device assembly and a right-most semiconductor device assembly) can be produced using a same, similar, or different process than described below. Also, reference numbers may be included in FIGS. 6A-6F that are not specifically discussed, but are shown by way of reference to other drawings (such as FIGS. 3A and 3B).

Figure 6A:
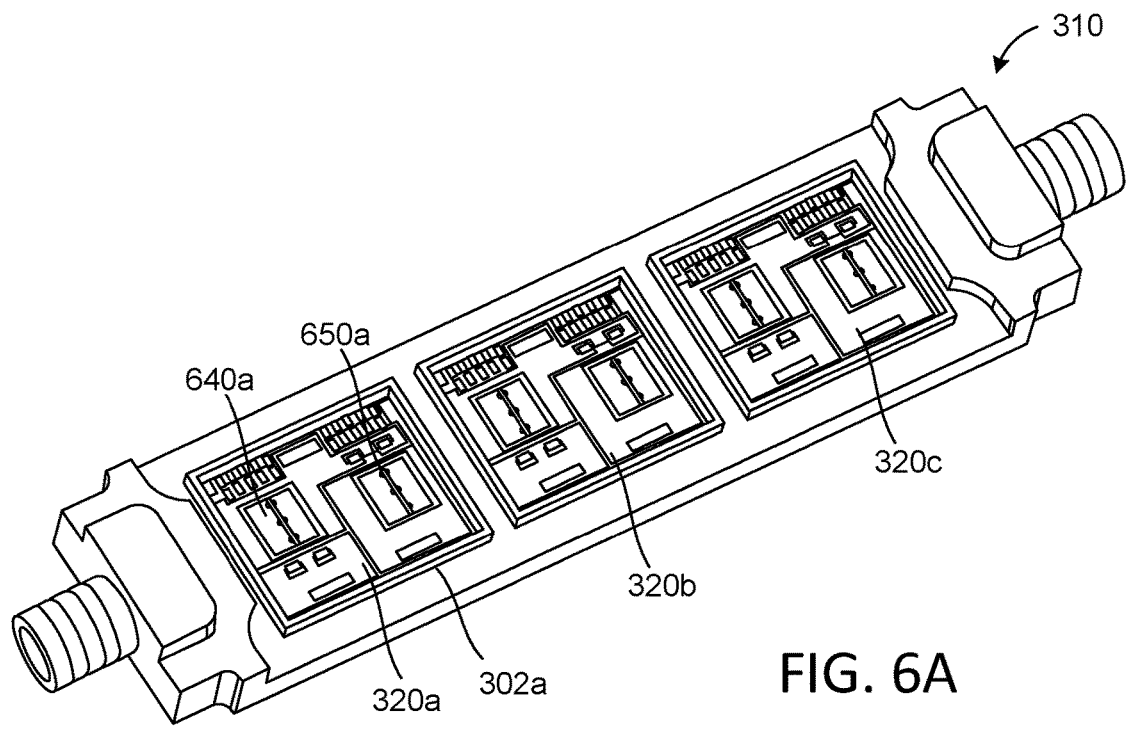
FIGS. 6A-6F are diagrams schematically illustrating another manufacturing process for producing semiconductor device modules (e.g., electronic device assemblies) using an implementation of the integrated substrates and water jacket of FIG. 3B.
Figure 6B:
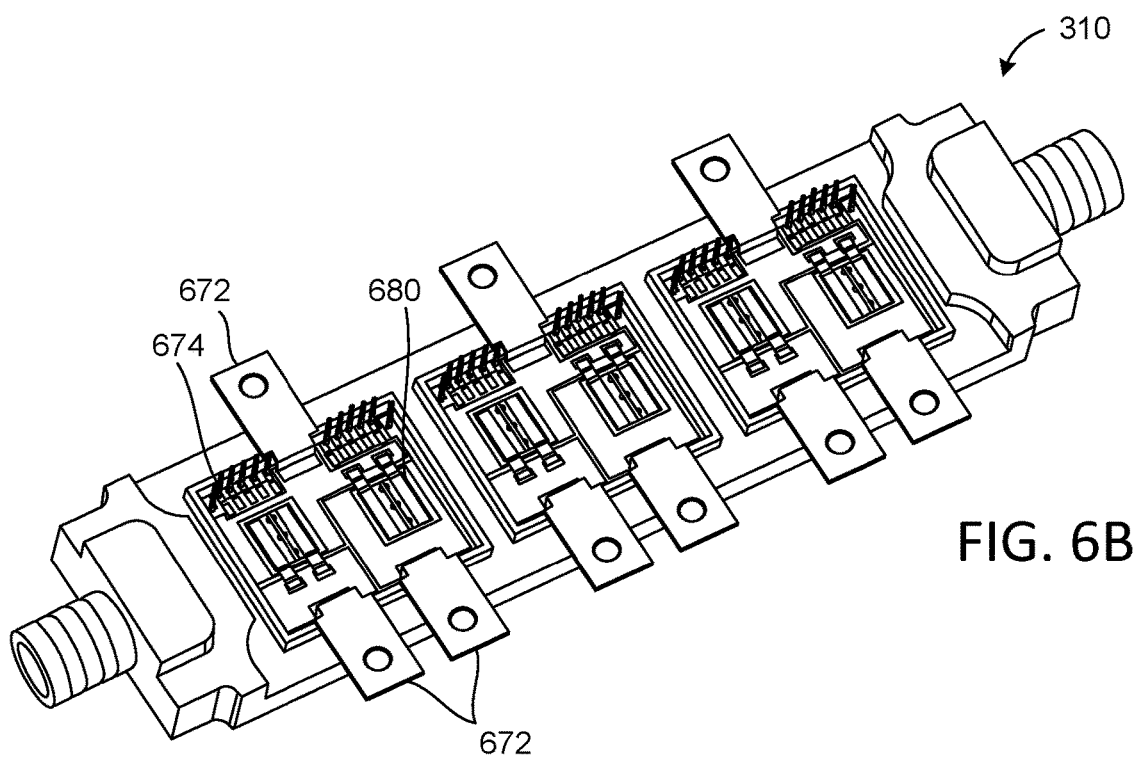

As shown in FIG. 6A, semiconductor devices 640a and 650a (e.g., wafer-level packaged devices, bare semiconductor die, etc.) can be coupled with the substrate 320a (e.g., on a patterned metal layer of the substrate 320a). As shown in FIG. 6B, a output and power terminals 672 can be coupled with (e.g., soldered to) the substrate 320a, where the output and power terminals 672 can extend outside the recess defined by the protrusion 302a of the water jacket 310.

As also shown in the FIG. 6B, signal pins 674 can be inserted (e.g., press-fit) into the substrate 320a. For instance, as with the signal pins 574, the signal pins 674 can be press-fit into plated openings in the substrate 320a, where the plated openings can be electrically connected with respective portions of a patterned metal layer of the substrate 320a. As also illustrated in FIG. 6B, at least one conductive clip 680 can be coupled with the semiconductor die 640a, the semiconductor die 650a and/or the substrate 320a (e.g., the patterned metal layer of the substrate 320a), e.g., to provide electrical connections between the substrate 320a, and the semiconductor die 640a and/or 640b.

Figure 6C:
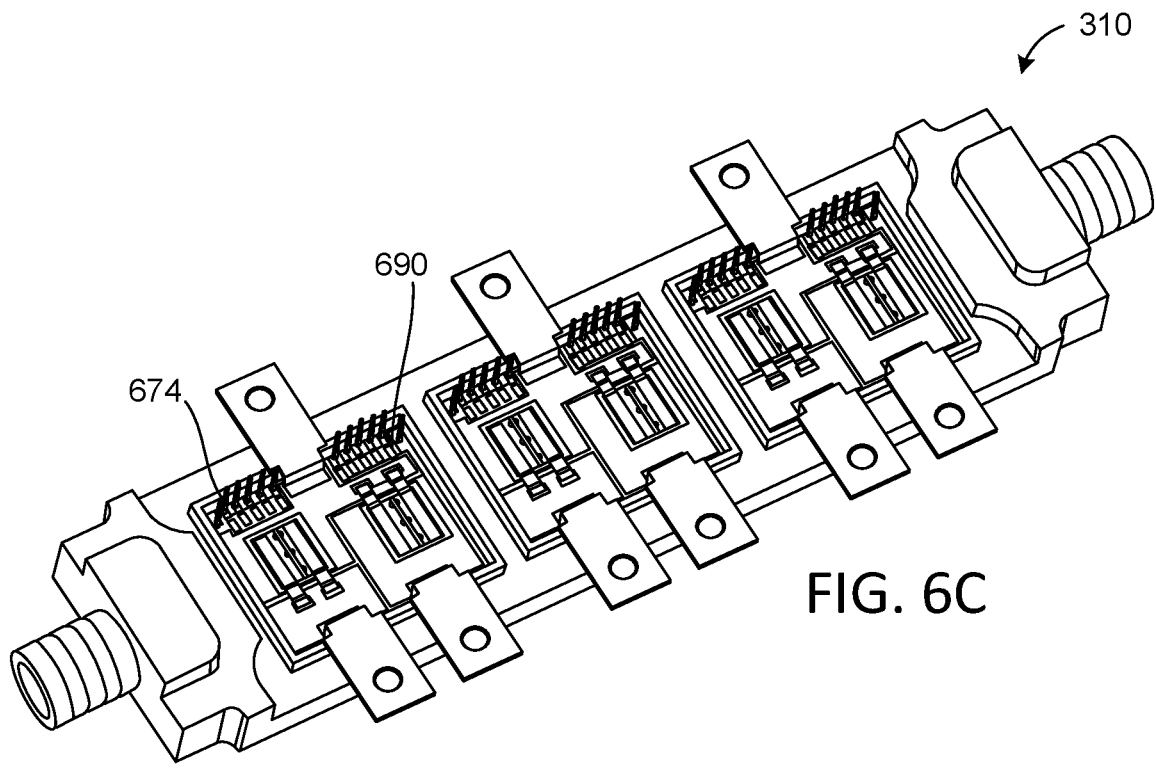
Figure 6D:
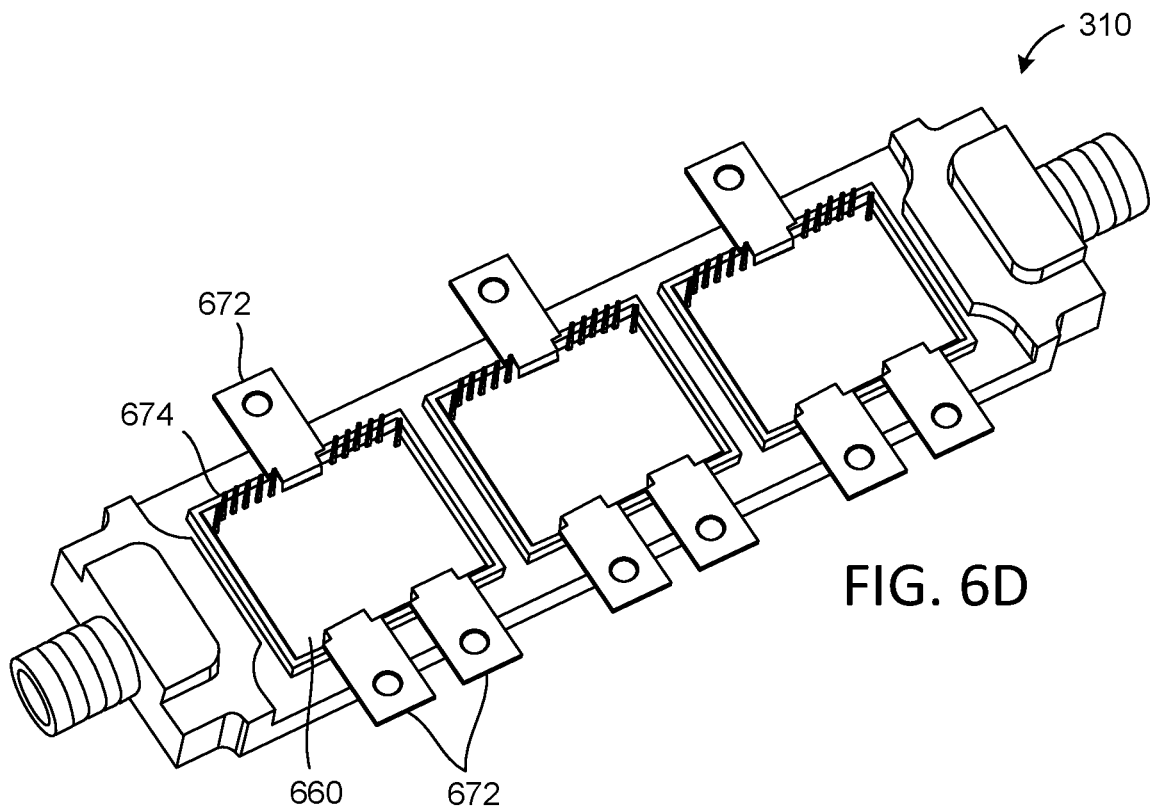

Referring now to FIG. 6C, wire bonds 690 can be formed, so as to establish respective electrical connections between the signal pins 674 and the semiconductor die 640a and/or 650a. As shown in FIG. 6D, the recess defined by the protrusion 302a (as shown in FIGS. 3A and 3B) can be filled, at least partially, with a molding compound 660 (e.g., an epoxy molding compound), which can be performed using a transfer molding process. As shown in FIG. 6D, the signal pins 674 can extend through the molding compound 660.

Figure 6E:
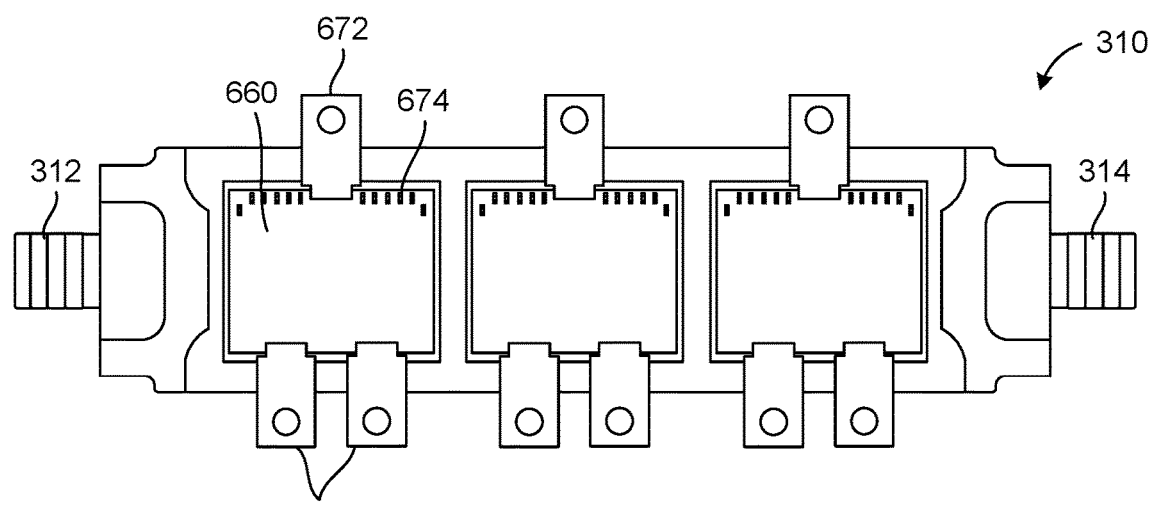
Figure 6F:
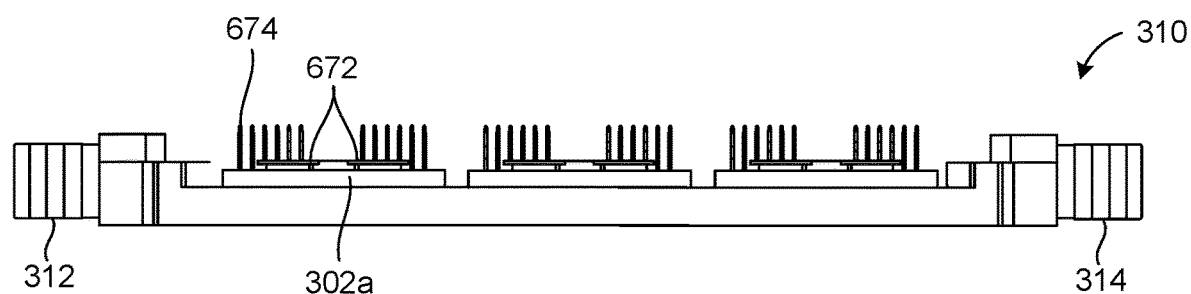

FIG. 6E illustrates a plan view of the water jacket 310 after producing three (e.g., left, center and right) integrated semiconductor device assemblies. FIG. 6F illustrates a side view corresponding with FIG. 6E (e.g., taken along a direction line 6F indicated in FIG. 6E). For purposes of reference and illustration, reference numbers are provided in FIGS. 6E and 6F for correspondence with, at least, FIGS. 3A-3B and 6A-6D, though the referenced elements are not specifically discussed again here with reference to FIGS. 6E and 6F.

FIGS. 7A-7G are diagrams schematically illustrating a manufacturing process for producing semiconductor device modules using an implementation of the integrated substrates 420a-420c and water jacket 410 of FIG. 4B. For purposes of illustration, the following discussion of the manufacturing process of FIGS. 7A-7G is described with reference to a single semiconductor device assembly (e.g., a left-most semiconductor device assembly in the FIGS. 7A-7G) that is integrated with the water jacket 410. It will be appreciated that other semiconductor device assemblies of FIGS. 7A-7G (e.g., a center semiconductor device assembly and a right-most semiconductor device assembly) can be produced using a same, similar, or different process than described below. Also, reference numbers may be included in FIGS. 7A-7G that are not specifically discussed, but are shown by way of reference to other drawings (such as FIGS. 4A and 4B).

Figure 7A:
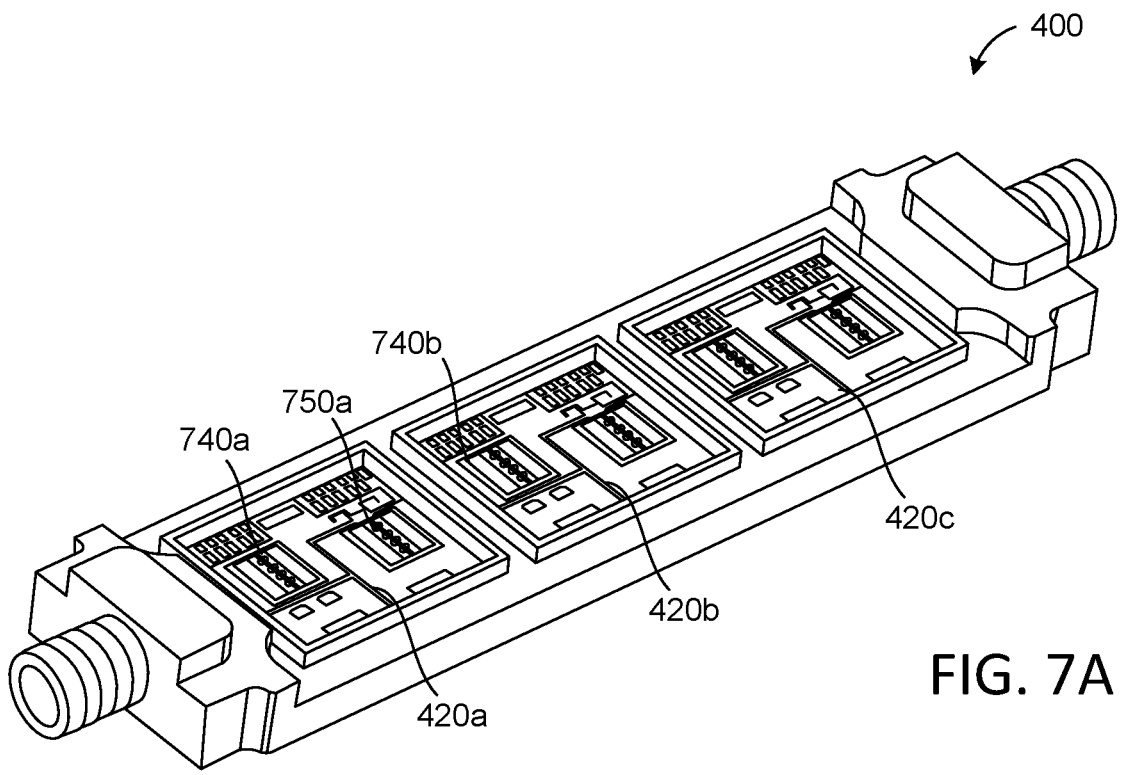
FIGS. 7A-7G are diagrams schematically illustrating a manufacturing process for producing semiconductor device modules (e.g., electronic device assemblies) using an implementation of the integrated semiconductor device assembly substrates and water jacket of FIG. 4B.
Figure 7B:
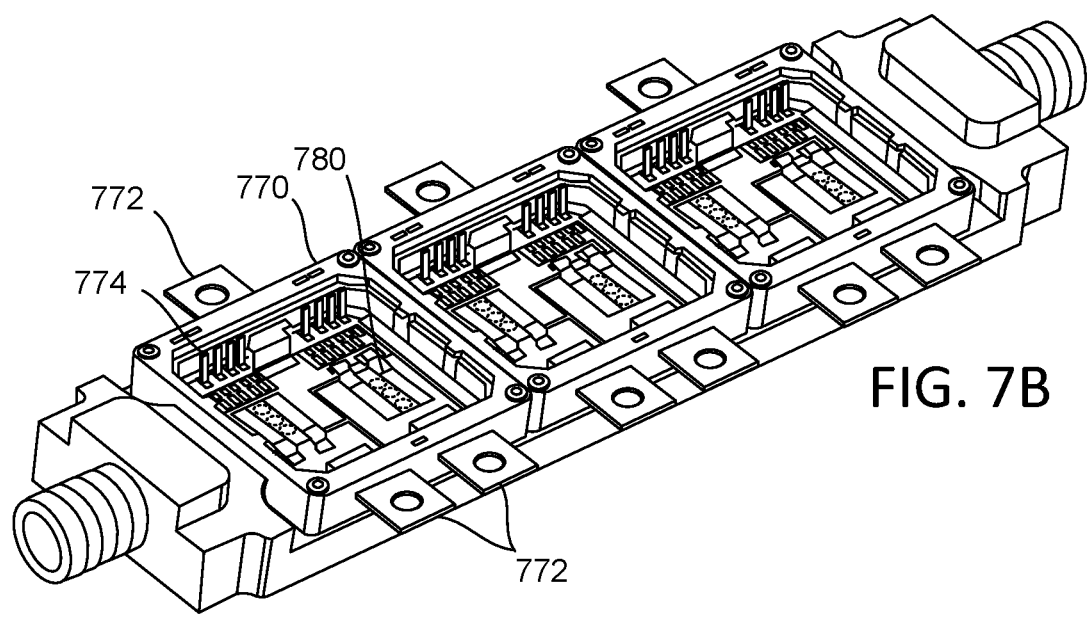

As shown in FIG. 7A, semiconductor devices 740a and 750a (e.g., wafer-level packaged devices, bare semiconductor die, etc.) can be coupled with the substrate 420a (e.g., on a patterned metal layer of the substrate 420a). As shown in FIG. 7B, a case 770 can be coupled with the water jacket 410, where the case 770, as with the case 570, can be an injection-molded plastic frame that surrounds the substrate 420a, and can further define the recess of the water jacket 410 defined by the protrusion 402a, as described with respect to FIGS. 4A and 4B.

As also shown in the FIG. 7B, the case 770 can include power and output terminal 772, that are molded in the case 770. As also shown in FIG. 7B, signal pins 774 can be inserted (e.g., press-fit) into the substrate 720a. For instance, the signal pins 774 can be press-fit into plated openings in the substrate 420a, where the plated openings can be electrically connected with respective portions of a patterned metal layer of the substrate 420a. As also illustrated in FIG. 7B, at least one conductive clip 780 can be coupled with the semiconductor die 740a, the semiconductor die 750a and/or the substrate 420a (e.g., the patterned metal layer of the substrate 420a), e.g., to provide electrical connections between the substrate 420a, and the semiconductor die 740a and/or 740b.

Figure 7C:
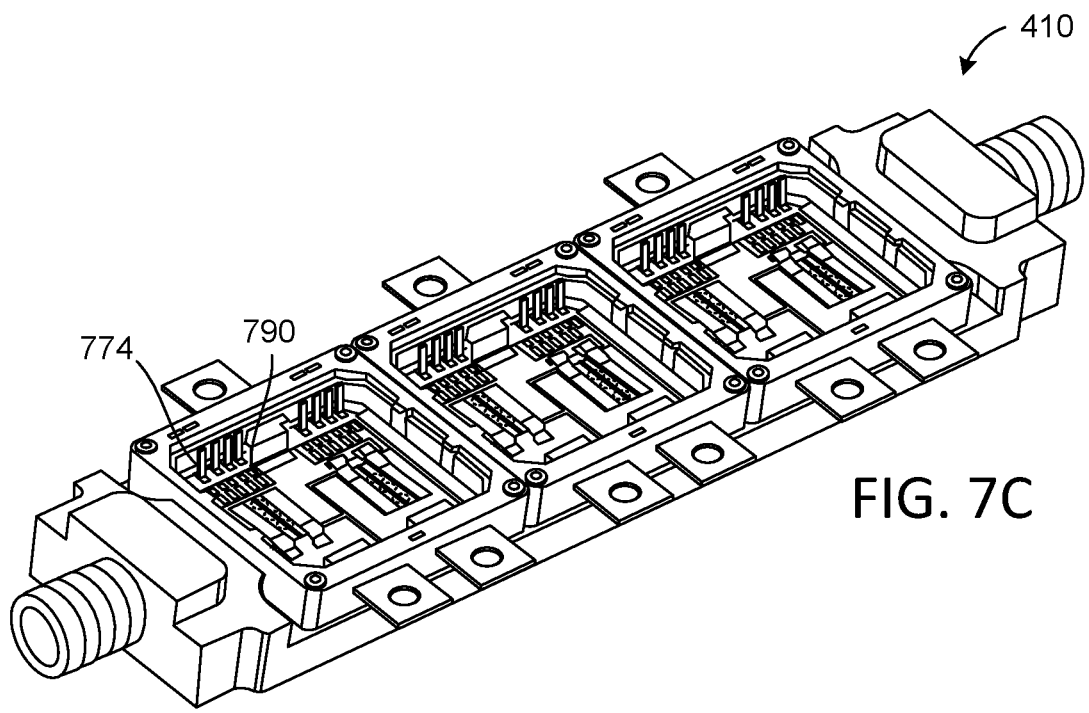
Figure 7D:
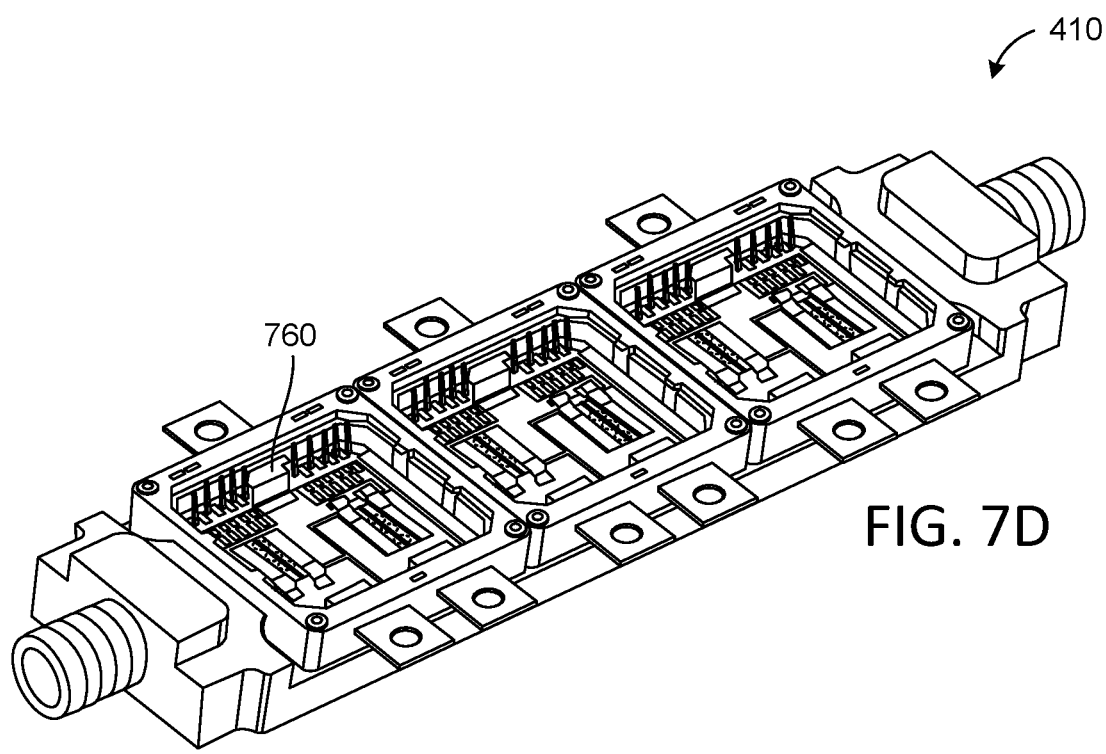
Figure 7E:
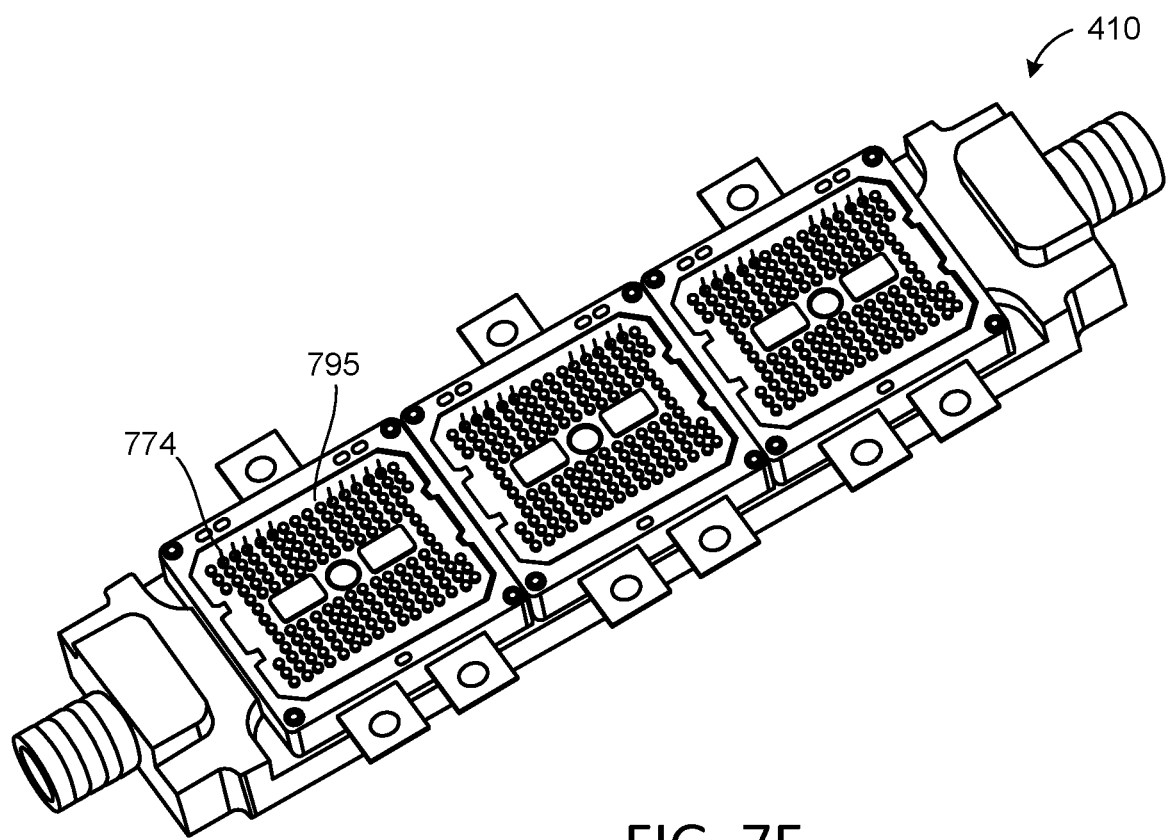

Referring now to FIG. 7C, wire bonds 790 can be formed, so as to establish respective electrical connections between the signal pins 774 and the semiconductor die 740a and/or 750a. As shown in FIG. 7D, the recess defined by the case 770 and/or the protrusion 402a (as shown in FIGS. 4A and 4B) can be filled, at least partially, with a molding compound 760 (e.g., a gel molding compound, or a resin molding compound), which can be translucent, and a cure operation can be performed to cure (set) the molding compound 760. As shown in FIG. 7D, the signal pins 774 can extend through the molding compound 760. Referring to FIG. 7E, a cover 795 can be coupled with the molding compound 560 using an adhesive material. As shown in FIG. 7E, the cover 795 can have through holes defined therein, and the signal pins 774 can extend through the cover 795 (e.g., via respective through holes).

Figure 7F:
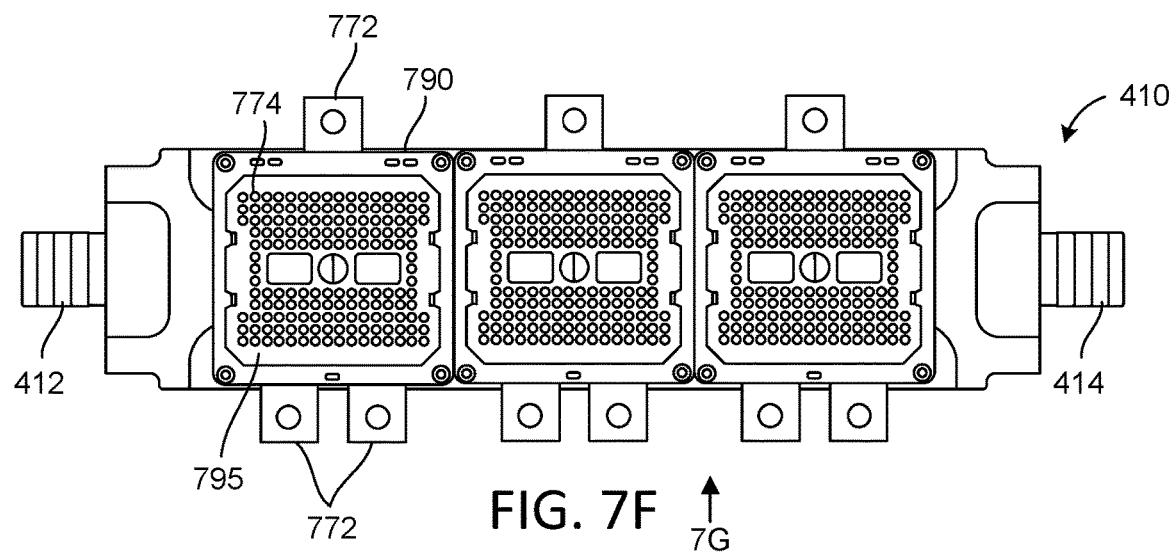
Figure 7G:
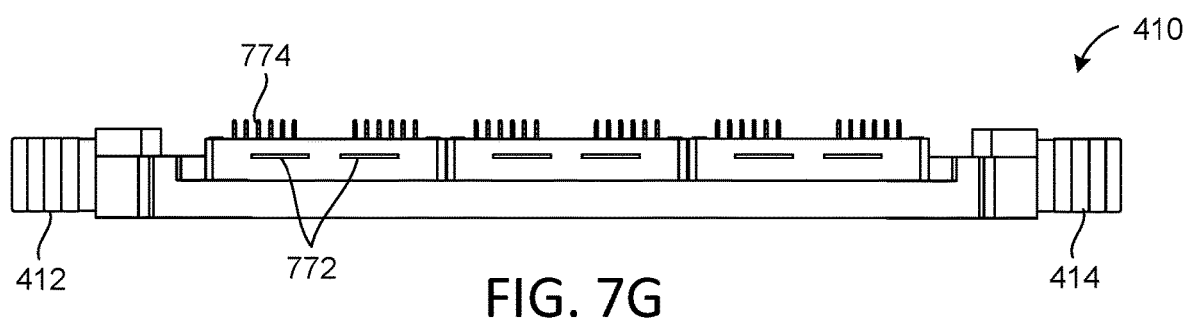

FIG. 7F illustrates a plan view of the water jacket 410 after producing three (e.g., left, center and right) integrated semiconductor device assemblies. FIG. 7G illustrates a side view corresponding with FIG. 7F (e.g., taken along a direction line 7G indicated in FIG. 7F). For purposes of reference and illustration, reference numbers are provided in FIGS. 7F and 7G for correspondence with, at least, FIGS. 4A-4B and 7A-7E, though the referenced elements are not specifically discussed again here with reference to FIGS. 7F and 7G.

FIGS. 8A-8F are diagrams schematically illustrating another manufacturing process for producing semiconductor device modules using an implementation of the integrated substrates 420a-420c and water jacket 410 of FIG. 4B. For purposes of illustration, the following discussion of the manufacturing process of FIGS. 8A-8F is described with reference to a single semiconductor device assembly (e.g., a left-most semiconductor device assembly in the FIGS. 8A-8F) that is integrated with the water jacket 410. It will be appreciated that other semiconductor device assemblies of FIGS. 8A-8F (e.g., a center semiconductor device assembly and a right-most semiconductor device assembly) can be produced using a same, similar, or different process than described below. Also, reference numbers may be included in FIGS. 8A-8F that are not specifically discussed, but are shown by way of reference to other drawings (such as FIGS. 4A and 4B).

Figure 8A:
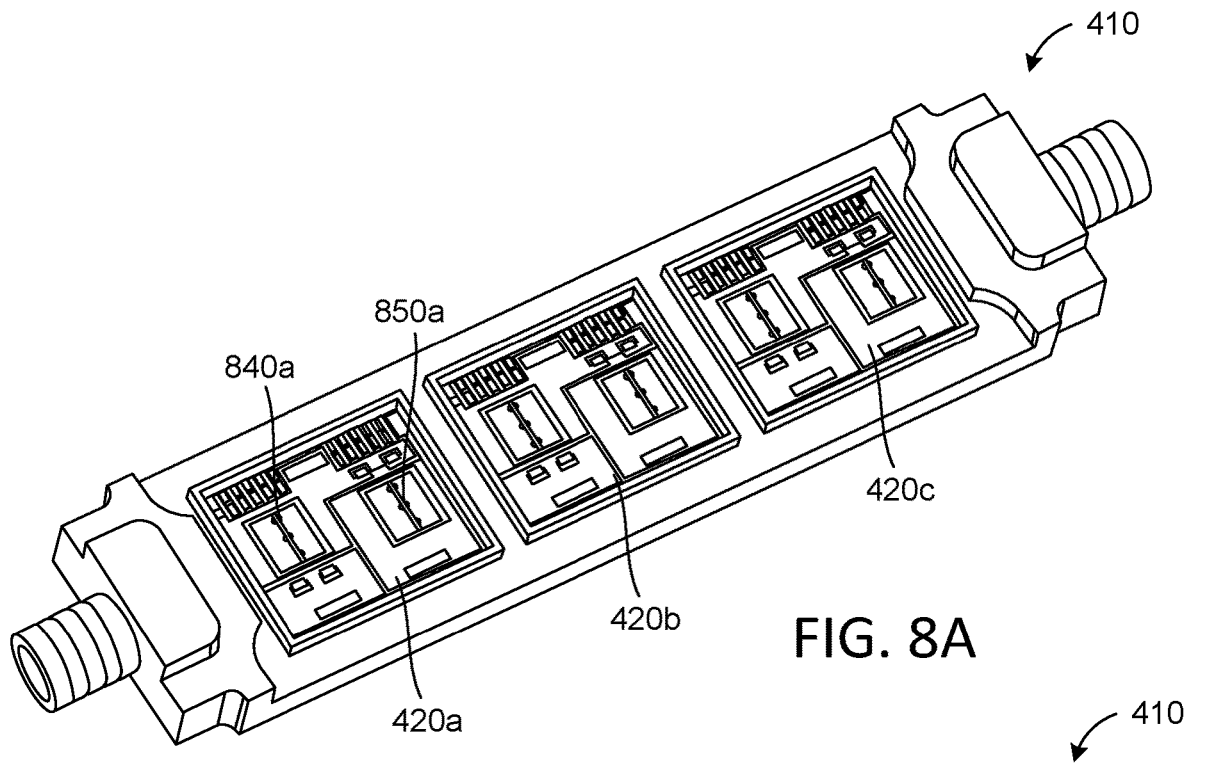
FIGS. 8A-8F are diagrams schematically illustrating another manufacturing process for producing semiconductor device modules (e.g., electronic device assemblies) using an implementation of the integrated semiconductor device assembly substrates and water jacket of FIG. 4B.
Figure 8B:
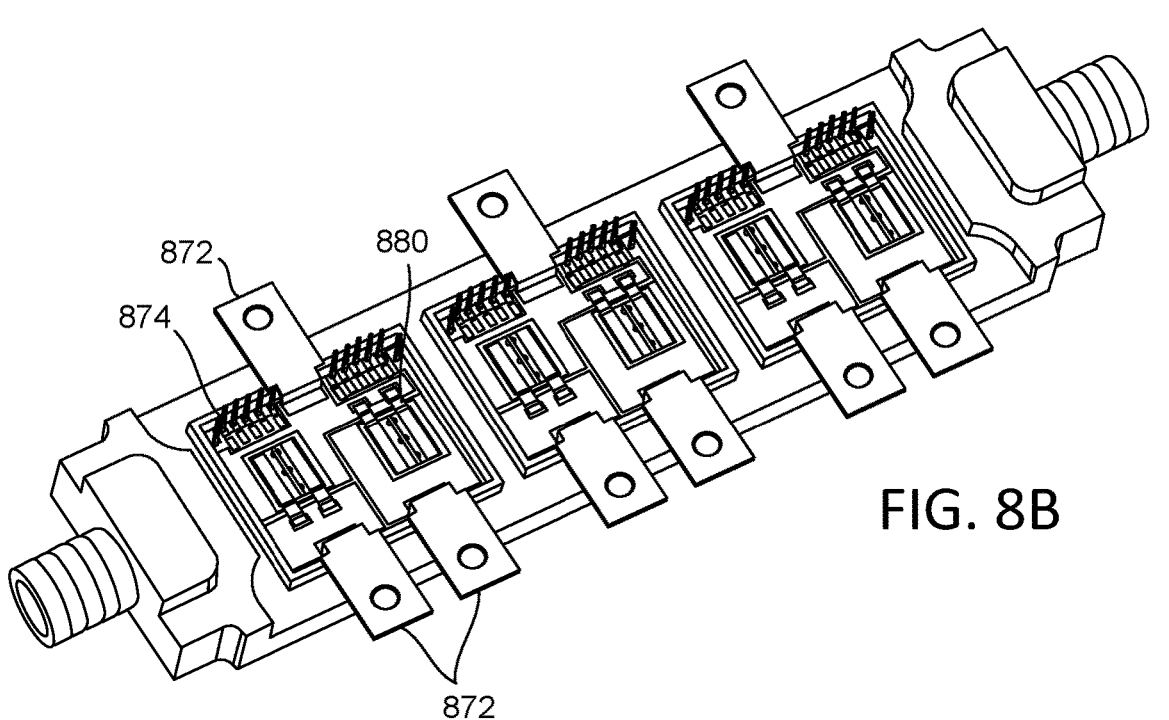

As shown in FIG. 8A, semiconductor devices 840*a* and 850*a* (e.g., wafer-level packaged devices, bare semiconductor die, etc.) can be coupled with the substrate 420*a* (e.g., on a patterned metal layer of the substrate 420*a*). As shown in FIG. 8B, a output and power terminals 872 can be coupled with (e.g., soldered to) the substrate 420*a*, where the output and power terminals 872 can extend outside the recess defined by the protrusion 402*a* of the water jacket 410.

As also shown in the FIG. 8B, signal pins 874 can be inserted (e.g., press-fit) into the substrate 420*a*. For instance, as with the signal pins 674, the signal pins 874 can be press-fit into plated openings in the substrate 420*a*, where the plated openings can be electrically connected with respective portions of a patterned metal layer of the substrate 420*a*. As also illustrated in FIG. 8B, at least one conductive clip 880 can be coupled with the semiconductor die 840*a*, the semiconductor die 850*a* and/or the substrate 420*a* (e.g., the patterned metal layer of the substrate 420*a*), e.g., to provide electrical connections between the substrate 420*a*, and the semiconductor die 840*a* and/or 840*b*.

Figure 8C:
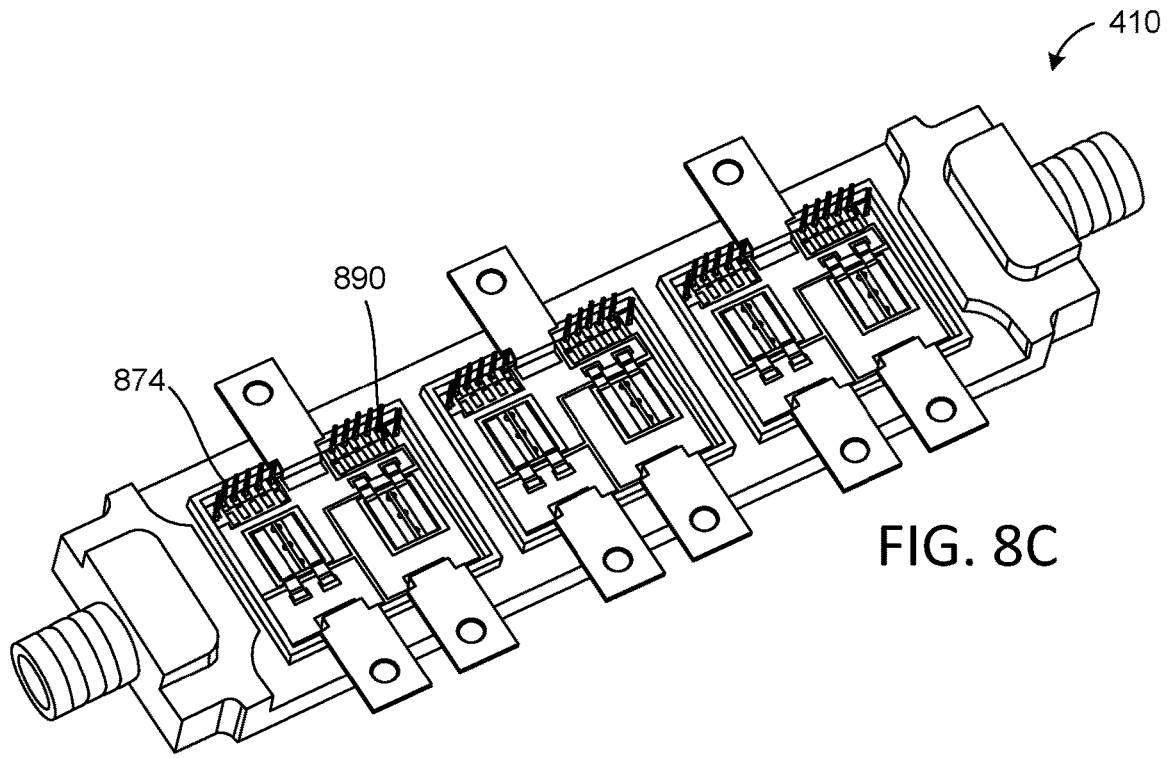
Figure 8D:
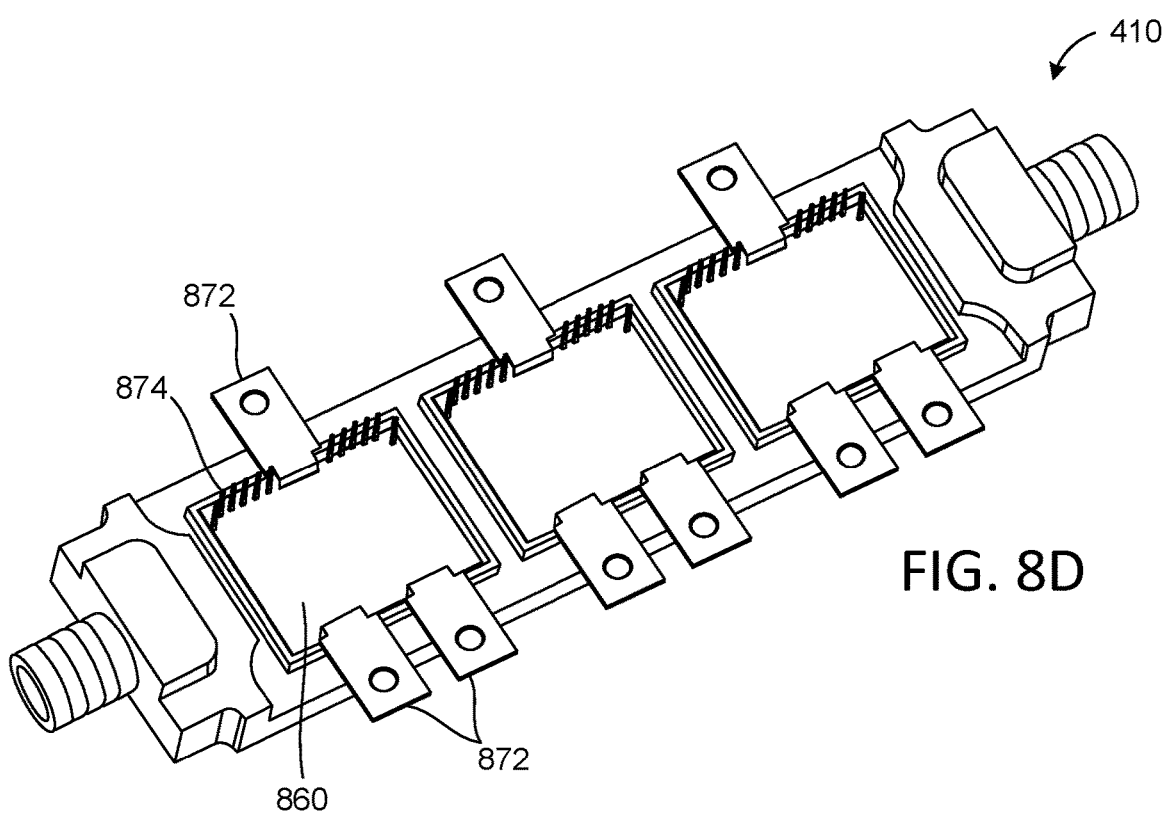

Referring now to FIG. 8C, wire bonds 890 can be formed, so as to establish respective electrical connections between the signal pins 874 and the semiconductor die 840*a* and/or 850*a*. As shown in FIG. 8D, the recess defined by the protrusion 402*a* (as shown in FIGS. 4A and 4B) can be filled, at least partially, with a molding compound 860 (e.g., an epoxy molding compound), which can be performed using a transfer molding process. As shown in FIG. 8D, the signal pins 874 can extend through the molding compound 860.

Figure 8E:
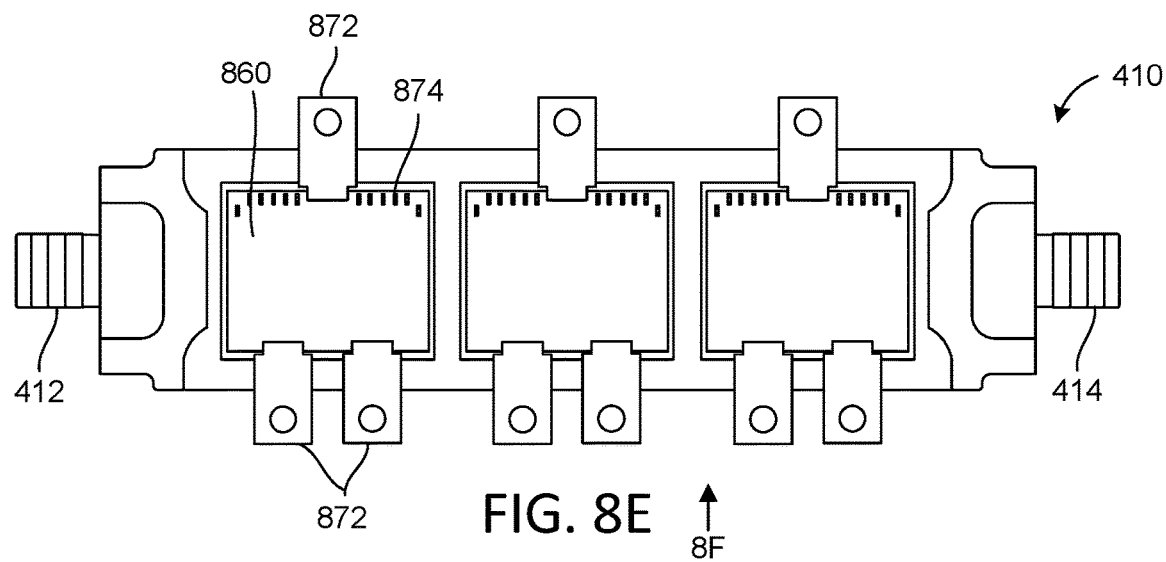
Figure 8F:
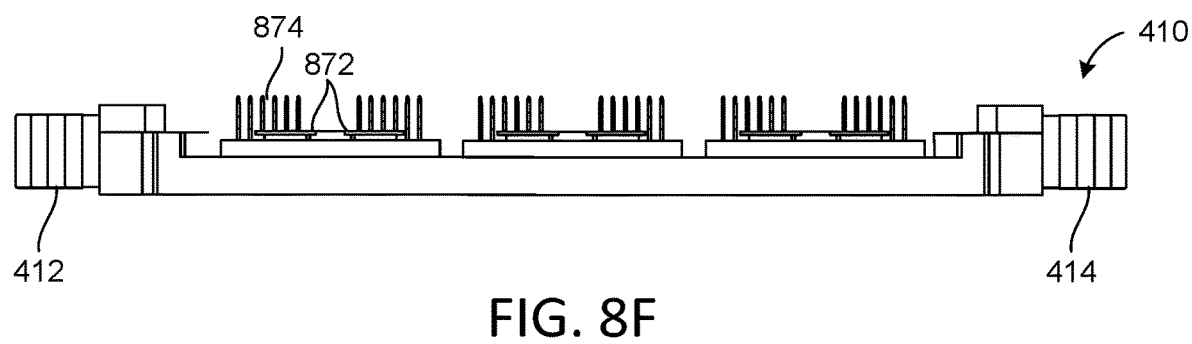

FIG. 8E illustrates a plan view of the water jacket 410 after producing three (e.g., left, center and right) integrated semiconductor device assemblies. FIG. 8F illustrates a side view corresponding with FIG. 8E (e.g., taken along a direction line 8F indicated in FIG. 8E). For purposes of reference and illustration, reference numbers are provided in FIGS. 8E and 8F for correspondence with, at least, FIGS. 4A-4B and 8A-8D, though the referenced elements are not specifically discussed again here with reference to FIGS. 8E and 8F.

Figure 9A:
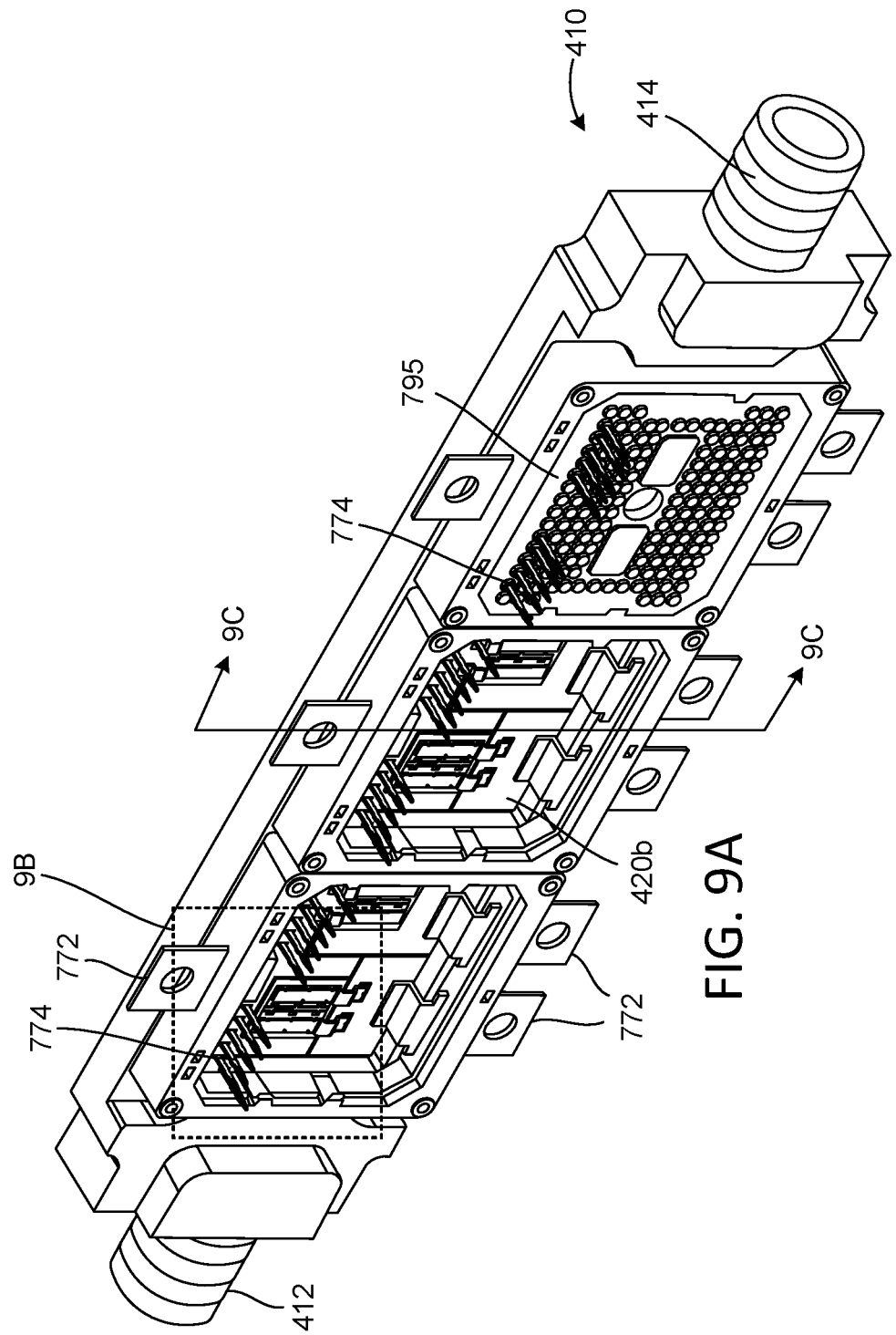

FIGS. 9A-9D are diagrams illustrating various aspects of an implementation of the semiconductor modules of, e.g., FIGS. 7A-7G. That is, the drawings in FIGS. 9A-9D illustrate arrangement and relationships of the elements of the assembly of FIGS. 7A-7G. For instance, FIG. 9A illustrates the heat pipe 410 and the three (e.g., left, center and right) semiconductor device modules integrated with the heat pipe. In FIG. 7A, only the right semiconductor module is shown with the cover 795 in place. A dashed line inset 9B is shown in FIG. 9A to indicate the portion of the assembly of FIG. 9A that is shown in FIG. 9B. With further reference to FIGS. 7A-7G, FIG. 9A illustrates the arrangement and relationships of the heat pipe 410, the cases 770, the output and power terminals 772, the signal pins 774 and the cover 795 in the illustrated example. Also shown in FIG. 9A are the inlet 412 and the outlet 414 of the fluidic channel of the water jacket 410. FIG. 9A also includes a section line 9C-9C that corresponds with the cross-sectional view shown in FIG. 9C.

FIG. 9B is a diagram that illustrates a magnified view of the portion of the assembly, of FIG. 9A, indicated by the dashed line 9B in FIG. 9A. The view of FIG. 9B shows the case 770, and a terminal 772 molded in the case 770. FIG. 9A also illustrates signal pins 774 press fit into the substrate 420*a* of the assembly. FIG. 9B further shows conductive clips 780 coupled with semiconductor device 740*a*, providing electrical connections between the semiconductor device 740*a* and the substrate 420*a*.

FIG. 9C is diagram illustrating a side, cross-sectional view of the assembly of FIG. 9A along the section line 9C-9C. FIG. 9C illustrates an arrangement and relationship of the water jacket 410, the cooling fins 415*b* of the water jacket 410 and the substrate 420*b*. FIG. 9C also shows an arrangement and relationship of a semiconductor die 740*b* on the substrate 420*a*, as well as conductive clip 780. In FIG. 9C, the arrangement of the case 770 on the water jacket 410, as well as the arrangement of the output and power terminals 772 in the case 770, is shown. FIG. 9C also illustrates signal pins 774 press-fit in the substrate 420*a*, as well as a wire bond 790, providing an electrical connection between a respective signal pin 774 and the semiconductor device 740*b* (e.g., via a patterned metal layer of the substrate 420*a*).

FIG. 9D is a diagram that illustrates a magnified view of the portion of the assembly of FIG. 9A, indicated by the dashed line 9D in FIG. 9C. FIG. 9D illustrates an arrangement and relationship of the cooling fins 415, the substrate 420*b*, the semiconductor device 740*b* and the conductive clip 780. FIG. 9D also illustrates portions of a patterned metal layer 430 disposed on the substrate 420*b*.

Figure 10:
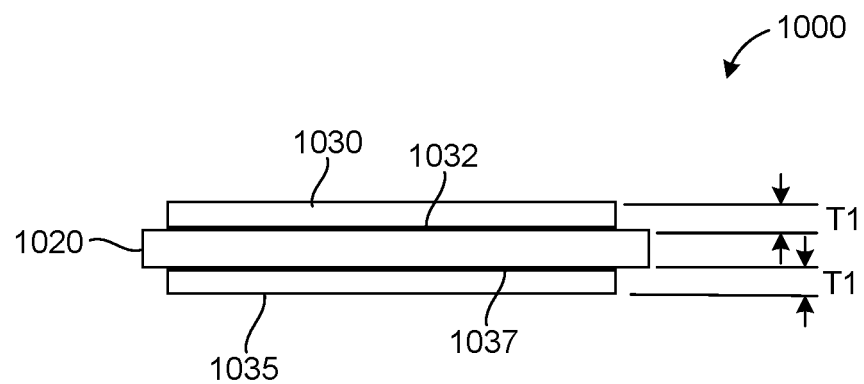
FIG. 10 is a diagram schematically illustrating a direct-bonded-metal-substrate.

In some implementations, substrates having configurations other than those described above (e.g., with respect to FIG. 1) can be implemented in semiconductor device assemblies, such as the assemblies described herein. For instance, a substrate 1000, as shown in FIG. 10 can be used to implement a semiconductor device assembly, such as the semiconductor device assemblies illustrated in for example, FIGS. 3A-4B. Referring to FIG. 10, the substrate 1000 can include a ceramic (dielectric) layer 1020, a first metal layer 1030, and a second metal layer 1035. In some implementations, the first metal layer 1030 can be patterned metal layer (e.g., on which one or more semiconductor die can be disposed), and the second metal layer can be an unpatterned metal layer that covers all of, or a majority of the bottom surface (as oriented in FIG. 10) of the ceramic layer 1020, though other combinations of patterned and/or unpatterned metal layers are possible. As shown in FIG. 10, the metal layers 1030 and 1035 (e.g., as well as the metal layer 130 in FIG. 1) can have a thickness of T1. In some implementations, the thickness T1 can be on the order of 300 micrometers (µm).

In some implementations, the metal layers 1030 and 1035 can be copper metal layers that are coupled to the ceramic layer 1020 using direct-bonding. For instance, in this example implementation, seed layers 1032 and 1037 (e.g., seed layers of titanium nitride (TiN)) can be applied to (e.g., sputtered on) the ceramic layer 1020. The copper layers 1030 and 1035 can then be diffusion-bonded to the ceramic layer 1020, where such diffusion bonding is facilitated by the respective seed layers 1032 and 1037. For example, the copper layers 1030 and 1035 can be diffusion-bonded to the ceramic layer 1020 at a temperature of 1000° C. and at pressure of 10 MPa. Referring to FIG. 1, in some implementations, the metal layer 130 can be diffusion-bonded to the ceramic layer 120 using the approach (or a similar approach) described with respect to the substrate 100 in FIG. 10.

In some implementations, approaches for coupling (e.g., diffusion bonding) a substrate (e.g., the substrate 1000 of FIG. 10) with a thermal dissipation appliance (e.g., a water jacket, heat sink, etc.), other than those described above, can be used to produce a semiconductor device assembly, such as the semiconductor device assemblies described herein.

Figure 11:
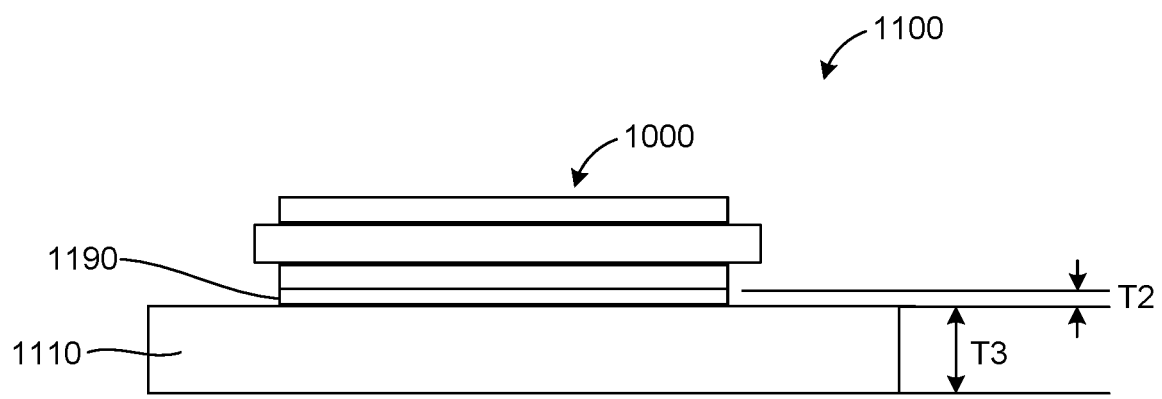
FIG. 11 is a diagram schematically illustrating a side view of an integrated semiconductor device assembly and thermal dissipation appliance that can include the direct-bonded-metal substrate of FIG. 10.

For instance, FIG. 11 illustrates a semiconductor device assembly 1100 that includes an implementation of the substrate 1000 of FIG. 10. In this example implementation, the substrate 1000 of FIG. 10 can be diffusion-bonded to a thermal dissipation appliance (e.g., a water jacket, heat sink, etc.) 1110 using a metal plate (metal layer, etc.) 1190. In some implementations, the metal plate 1190 can be an aluminum (Al) plate having a thickness of T2, where T2 can be on the order of, e.g., 100 μm.

In some implementations, diffusion bonding between the substrate 1000 and the metal plate 1190, as well as diffusion bonding between the metal plate 1190 and the thermal dissipation appliance 1110, can be performed at a temperature of 540° C. and a pressure of 7 MPa (e.g., at different conditions than used for diffusion bonding the metals layers 1030 and 1035 to the ceramic layer 1020 of the substrate 1000). In other implementations, other materials can be used for diffusion bonding the substrate 1000 to the thermal dissipation appliance 1110, and/or diffusion bonding can be performed using different conditions (e.g., temperature and/or pressure). As shown in FIG. 11, the thermal dissipation appliance (e.g., water jacket, heat sink, etc.) can have a thickness of T3, where T3 can be on the order of 15 millimeters (mm). Depending on the implementation, the thermal dissipation appliances described herein can be formed from a metal, such as copper, a copper alloy, etc., and can have thicknesses that are the same, or different than described with respect to FIG. 11.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

While certain features of the described implementations have been illustrated as described herein, many modifications, substitutions, changes and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method for producing an electronic device assembly, the method comprising:
    coupling a semiconductor die with a patterned metal layer of a ceramic substrate, the patterned metal layer being disposed on a first surface of the ceramic substrate; and
    direct-bonding a second surface of the ceramic substrate to a plurality of cooling fins of a water jacket, the second surface of the ceramic substrate being opposite the first surface and defining a portion of a fluidic channel of the water jacket, the plurality of cooling fins being disposed within the fluidic channel of the water jacket.

2. The method of claim 1, wherein direct-bonding the second surface of the ceramic substrate to the plurality of cooling fins includes diffusion-bonding the second surface of the ceramic substrate with the plurality of cooling fins.

3. The method of claim 1, wherein direct-bonding the second surface of the ceramic substrate to the plurality of cooling fins includes brazing the second surface of the ceramic substrate with the plurality of cooling fins.

4. The method of claim 1, further comprising encapsulating the semiconductor die and the ceramic substrate in a molding compound.

5. The method of claim 4, further comprising coupling a cover with the molding compound.

6. The method of claim 5, electrically coupling at least one signal pin with the ceramic substrate, the at least one signal pin extending through the molding compound and the cover.

7. The method of claim 1, wherein the water jacket includes a recess, the semiconductor die and the ceramic substrate being disposed in the recess.

8. The method of claim 7, further comprising:
    encapsulating the semiconductor die and the ceramic substrate in a molding compound;
    coupling a cover with the molding compound, the molding compound and the cover being disposed in the recess; and
    coupling at least one signal pin with the ceramic substrate, the at least one signal pin extending through the molding compound and the cover.

9. A method for producing an electronic device assembly, the method comprising:
    coupling a first semiconductor die with a metal layer disposed on a first surface of a first ceramic substrate;
    coupling a second semiconductor die with a metal layer disposed on a first surface of a second ceramic substrate;
    direct-bonding a second surface of the first ceramic substrate to a plurality of cooling fins of a water jacket, the second surface of the first ceramic substrate being opposite the first surface of the first ceramic substrate and defining a portion of a fluidic channel of the water jacket, the plurality of cooling fins being disposed within the fluidic channel of the water jacket; and direct-bonding a second surface of the second ceramic substrate to the water jacket, the second surface of the second ceramic substrate being opposite the first surface of the second ceramic substrate.

10. The method of claim 9, wherein direct-bonding the first ceramic substrate and the second ceramic substrate to the water jacket includes one of diffusion-bonding or brazing the first ceramic substrate and the second ceramic substrate to the water jacket.

11. The method of claim 9, wherein:
the plurality of cooling fins is a first plurality of cooling fins of the water jacket;
the portion of the fluidic channel is a first portion of the fluidic channel; and
direct-bonding the second ceramic substrate to the water jacket includes direct-bonding the second surface of the second ceramic substrate to a second plurality of cooling fins of the water jacket, the second ceramic substrate defining a second portion of a fluidic channel of the water jacket.

12. The method of claim 9, further comprising:
encapsulating the first semiconductor die, the first ceramic substrate, the second semiconductor die, and the second ceramic substrate in a molding compound.

13. The method of claim 12, further comprising:
electrically coupling a first signal pin with the first ceramic substrate, the first signal pin extending through a first portion of the molding compound encapsulating the first semiconductor die and the first ceramic substrate; and
electrically coupling a second signal pin with the second ceramic substrate, the second signal pin extending through a second portion of the molding compound encapsulating the second semiconductor die and the second ceramic substrate.

14. The method of claim 13, further comprising coupling a first cover with the first portion of the molding compound, the first signal pin extending through the first cover.

15. The method of claim 12, wherein:
a first portion of the molding compound, the first semiconductor die, and the first ceramic substrate are disposed in a first recess of the water jacket; and
a second portion of the molding compound, the second semiconductor die, and the second ceramic substrate are disposed in a second recess of the water jacket.

16. A method for producing an electronic device assembly, the method comprising:
coupling a semiconductor die with a first metal layer disposed on a first surface of a ceramic substrate; and
diffusion-bonding a second metal layer disposed on a second surface of the ceramic substrate to a plurality of cooling fins disposed within a fluidic channel of a water jacket, the second surface of the ceramic substrate being opposite the first surface of the ceramic substrate, at least one of the second metal layer or the second surface of the ceramic substrate defining a portion of a fluidic channel of the water jacket.

17. The method of claim 16, wherein diffusion-bonding the second metal layer to the plurality of cooling fins includes diffusion-bonding the second metal layer to the plurality of cooling fins via a metal plate.

18. The method of claim 16, further comprising encapsulating the semiconductor die and the ceramic substrate in a molding compound.

19. The method of claim 18, wherein the semiconductor die, the ceramic substrate and the molding compound are disposed in a recess of the water jacket.

20. The method of claim 18, further comprising:
coupling a cover with the molding compound; and
electrically coupling at least one signal pin with the ceramic substrate, the at least one signal pin extending through the molding compound and the cover.

* * * * *